United States Patent
Snow et al.

(10) Patent No.: US 11,927,621 B2
(45) Date of Patent: Mar. 12, 2024

(54) CRYOGENIC WAFER TESTING SYSTEM

(71) Applicant: High Precision Devices, Inc., Boulder, CO (US)

(72) Inventors: Michael Snow, Erie, CO (US); Joshua West, Boulder, CO (US)

(73) Assignee: High Precision Devices, Inc., Boulder, CO (US)

( * ) Notice: Subject to any disclaimer, the term of this patent is extended or adjusted under 35 U.S.C. 154(b) by 154 days.

(21) Appl. No.: 17/777,580

(22) PCT Filed: Nov. 19, 2020

(86) PCT No.: PCT/US2020/061355
§ 371 (c)(1),
(2) Date: May 17, 2022

(87) PCT Pub. No.: WO2021/102181
PCT Pub. Date: May 27, 2021

(65) Prior Publication Data
US 2023/0014966 A1   Jan. 19, 2023

Related U.S. Application Data

(60) Provisional application No. 62/937,443, filed on Nov. 19, 2019, provisional application No. 62/978,766, (Continued)

(51) Int. Cl.
*G01R 31/00* (2006.01)
*G01R 31/28* (2006.01)
(Continued)

(52) U.S. Cl.
CPC ..... *G01R 31/2877* (2013.01); *G01R 31/2862* (2013.01); *H01L 21/67109* (2013.01); *H01L 21/68785* (2013.01)

(58) Field of Classification Search
CPC ............ G01R 31/2862; G01R 31/2867; G01R 31/2877; G01R 31/2865; H01L 21/67109;
(Continued)

(56) References Cited

U.S. PATENT DOCUMENTS 5,733,426 A    3/1998   Cox et al.
5,835,997 A *  11/1998  Yassine .............. G01R 31/2851
                                                        324/754.03
(Continued)

FOREIGN PATENT DOCUMENTS

DE    102005015334 B4    2/2017
JP       S5941846 A       8/1984
(Continued)

OTHER PUBLICATIONS

Ari Kuukkala: "Quantum Computing Sets New Demand for Wafer Probing", Semiconductor Wafer Test Conference 2019, Jun. 5, 2019 (Jun. 5, 2019), XP055635796, San Diego, California, Retrieved from the Internet: URL:https://www.swtest.org/swtw_library/2019proc/PDF/S08_01_Kuukkala_SWTest_2019.pdf [retrieved on Oct. 4, 2019].
(Continued)

*Primary Examiner* — Thang X Le
(74) *Attorney, Agent, or Firm* — KOLITCH ROMANO DASCENZO GATES LLC

(57) ABSTRACT

Cryogenic testing systems for testing electronic components such as wafers under cryogenic conditions are provided. The novel designs enable fast throughput by use of a cryogenically maintained test surface to which wafers may be rapidly introduced, cooled, and manipulated to contact testing elements while maintaining high quality cryogenic conditions. Thermal shielding is achieved by floating shields and/or flexible bellows that provide effective thermal shielding of the test environment while enabling manipulation of wafers
(Continued)

with a wide range of motion. Also provided are novel door assemblies, chuck configurations, and vacuum plate bases that enable effective maintenance of cryogenic conditions and high throughput.

32 Claims, 19 Drawing Sheets

Related U.S. Application Data filed on Feb. 19, 2020, provisional application No. 63/020,069, filed on May 5, 2020.

(51) Int. Cl.
*H01L 21/67* (2006.01)
*H01L 21/687* (2006.01)

(58) Field of Classification Search
CPC ........... H01L 21/6719; H01L 21/68728; H01L 21/67288; H01L 21/68742; H01L 21/68785
See application file for complete search history.

(56) References Cited

U.S. PATENT DOCUMENTS

| | | | |
|---|---|---|---|
| 7,046,025 | B2 | 5/2006 | Schneidewind et al. |
| 7,703,823 | B2 | 4/2010 | Harless et al. |
| 8,497,693 | B2 | 7/2013 | Kiesewetter et al. |
| 8,692,567 | B2 | 4/2014 | Teich et al. |
| 2003/0155939 | A1* | 8/2003 | Lutz .................. G01R 31/2865 324/750.09 |
| 2014/0028337 | A1* | 1/2014 | Kiesewetter ....... G01R 31/2891 324/750.03 |
| 2019/0204378 | A1 | 7/2019 | Gopal et al. |
| 2021/0225803 | A1* | 7/2021 | Von Känel ............. H01L 24/75 |

FOREIGN PATENT DOCUMENTS

| | | |
|---|---|---|
| JP | 2011222851 A1 | 11/2011 |
| JP | 2018195820 A1 | 12/2018 |
| JP | 2019106491 A1 | 6/2019 |
| KR | 1020190078791 A1 | 7/2019 |

OTHER PUBLICATIONS

N.A. N.A.: "FWP6 Probe Station Operating Guide", Jun. 1, 2005 (Jun. 1, 2005), pp. 1-70, XP055635817, Retrieved from the Internet:URL:https://www.equipx.net/uploads/Lakeshore%20Cryogenics/LakeshoreCryogenicsFWP6Manual.pdf [retrieved on Oct. 24, 2019].

Daughton David R et al: "Cryogenic temperature, 2-port, on-wafer characterization at WR-5.1 frequencies", 2016 IEEE MTT-S International Microwave Symposium (IMS), IEEE, May 22, 2016 (May 22, 2016), pp. 1-4. XP032941142, DOI: 10.1109/MWSYM.2016.7540118 [retrieved on Aug. 10, 2016].

Xie Linli et al: "Micromachined probes with integrated GaAs Schottky diodes for on-wafer temperature sensing", 2018 IEEE International Instrumentation and Measurement Technology Conference (I2MTC), IEEE, May 14, 2018 (May 14, 2018), pp. 1-6, XP033374237, DOI: 10.1109/I2MTC.2018.8409690 [retrieved on Jul. 10, 2018].

* cited by examiner

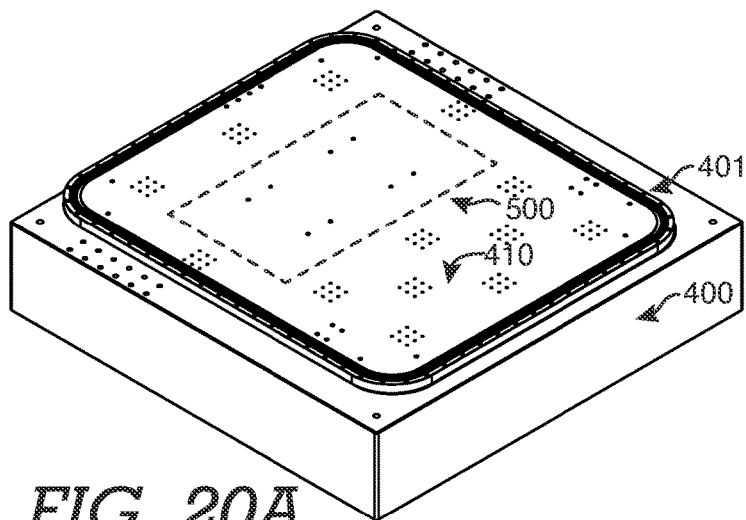
FIG. 20A
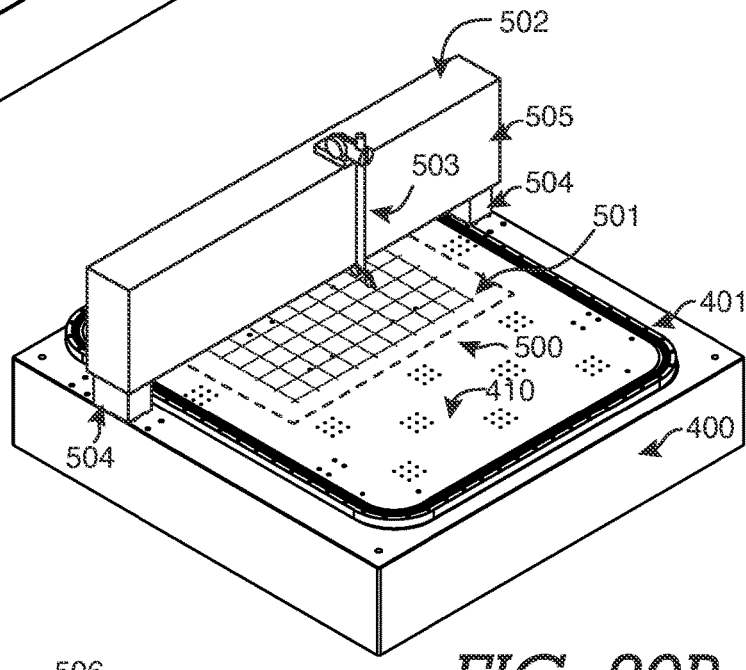
FIG. 20B
| +34 | +35 | +30 | +30 | +30 | +24 | +20 | +20 | +13 | +8 |
|---|---|---|---|---|---|---|---|---|---|
| +31 | +30 | +32 | +28 | +28 | +29 | +24 | +22 | +22 | +13 |
| +25 | +24 | +22 | +23 | +21 | +14 | +18 | +14 | +12 | +10 |
| +16 | +12 | +12 | +12 | +12 | +8 | +6 | +4 | +2 | +1 |
| +11 | +10 | +7 | +4 | 0 | +1 | +4 | +6 | +8 | +13 |
| +6 | +5 | +2 | +2 | +4 | +4 | +10 | +12 | +14 | +21 |
| +2 | 0 | +2 | +2 | +6 | +3 | +12 | +14 | +14 | +22 |
FIG. 20C

CRYOGENIC WAFER TESTING SYSTEM

CROSS-REFERENCE TO RELATED APPLICATIONS

This application is a 35 USC § 371 national stage filing of International Patent Application Serial Number PCT/US2020/061355, entitled "Cryogenic Wafer Testing System," filed Nov. 19, 2020, which application claims the benefit of priority to: U.S. Provisional Application Ser. No. 62/937,443, entitled "System for High Throughput Testing of Electronic Components Under Cryogenic Conditions," filed Nov. 19, 2019; U.S. Provisional Application Ser. No. 62/978,766, entitled "Precision Vacuum Chamber Surfaces," filed Feb. 19, 2020; and U.S. Provisional Application Ser. No. 63/020,069, entitled "Efficient Low Temperature Wafer Probe Station," filed May 5, 2020, the contents which are hereby incorporated by reference.

STATEMENT REGARDING FEDERALLY SPONSORED RESEARCH OR DEVELOPMENT

Not Applicable.

BACKGROUND OF THE INVENTION

Driven by the demand for increased processing power and the processing needs of quantum computing circuits, there is an ongoing and substantial effort to develop cryogenic computers. In cryogenic computing, the operation of the processing components under extremely low temperatures prov ides the conditions to eliminate electrical resistance, thus drastically decreasing the power requirements for computer processing. Cryogenic technology platforms employ cryogenic devices fabricated on silicon wafers or like substrates. A critical process in the manufacture and distribution of cryogenic computers is wafer testing. Wafer testing, or wafer probing, includes testing and identifying functional defects in the electronic components located on a wafer. Wafer testing may also provide validation information to improve the fabrication process. A wafer is typically placed on a testing surface. A wafer prober makes electrical contact with one or more fabricated circuits located on the surface of the wafer, in order to identify the useable circuits. After the wafer is cut into individual dies, the unusable dies are sorted from usable components and may be further processed or removed from production.

In the case of cryogenic devices, the wafers must be tested under the relevant conditions at which the circuits will be deployed, for example, at cryogenic temperatures between 0K and 6K. Due to the extremely low temperature requirements, there is a considerable challenge associated with cooling the wafers to these temperatures, and in maintaining the thermal environment during testing.

Currently, in one common method, the wafer is cooled concurrently with the working environment. For instance, currently available solutions involve placing a wafer on a carrier or plate, and cooling the carrier, wafer, and testing environment together to a designated temperature. The repeated cooling of the working environment to cryogenic temperatures for each wafer requires substantial time and results in very low throughput.

Another known approach involves the direct cooling of the wafer in a cryogenically maintained test environment. In standard direct cooling implementations, the wafer is either mechanically constrained to a carrier, or adhered to a carrier by adhesive greases or other materials, such as indium. The constrained or adhered wafer is introduced into the cryogenic testing environment, where it is cooled from ambient temperatures to cryogenic temperatures. In this implementation, the wafer must be cleaned of adhesive after testing, necessitating a burdensome additional step in the process. The additional handling and process steps also risk loss of devices from damage. Further, significant thermal mass is potentially added to the wafer, resulting in reduced throughput, and higher energy and/or helium consumption for cooling the system.

Another obstacle to effective testing of certain cryogenic devices is the need for effective magnetic shielding. For these cryogenic devices, stray magnetic fields may change the conductivity of devices on the wafer or trap troublesome magnetic flux in critical spots, reducing device performance or inhibiting functionality all together. Accordingly, the wafers must be shielded from stray magnetic fields during the testing process. Maintaining high quality magnetic shielding and simultaneously maintaining cryogenic conditions in the test environment presents a serious engineering challenge.

Yet another obstacle for effective testing of certain devices is the requirement for maintaining a flat and level testing surface within a vacuum environment. In order to achieve and maintain a vacuum environment, particularly under cryogenic conditions, the outer housing of such testing instrument can be exposed to a great amount of vacuum force. Due to the vacuum force, there is a need to mitigate the warping of certain surfaces, particularly surfaces that support highly sensitive testing instruments such as precision actuators or motion stages.

In some implementations, the use of a "dry" probe station is desirable, wherein closed system cooling elements are utilized to maintain the desired testing environment temperatures while preventing the escape of expensive liquid helium or other coolants.

Various cryogenic wafer testing systems are known in the art. For example, U.S. Pat. No. 8,497,693B2 to Kiesewetter et al. entitled, "Method for testing a test substrate under defined thermal conditions and thermally conditionable prober" describes a system wherein a temperature-controllable chuck and is set to a defined temperature and the test substrate is positioned relative to test probes by at least one positioning device. U.S. Pat. No. 8,692,567 to Teich et al., entitled "Method for verifying a test substrate in a prober under defined thermal conditions," disclosing a system wherein a housing having at least two housing sections, in one housing section of which, designated hereinafter as test chamber, the test substrate to be verified is held by a chuck and is set to a defined temperature, and in the other housing section of which, designated hereinafter as probe chamber, probes are held. U.S. Pat. No. 7,046,025 to Schneidewind et al, entitled "Test apparatus for testing substrates at low temperatures" discloses a system wherein a vacuum chamber which surrounds the working area of the chuck, wherein the chuck is e thermally decoupled from an uncooled chuck drive and wherein the cooled chuck and the cooled test substrate are shielded from the thermal radiation of the surrounding uncooled assemblies by means of a directly cooled thermal radiation shield. Despite the contributions of these prior systems, the achievement of high throughput and high quality wafer positioning while maintaining thermal and magnetic shielding with the efficient use of cryogens has remained a substantial challenge.

Accordingly, there remain several unmet needs in the art. There is a need for a wafer testing apparatus and method that consistently and efficiently maintains the probing environment at cryogenic temperatures, for example, between 0K and 6K. There is a need for a wafer testing apparatus and method that allows for high throughput testing of wafers under these cryogenic temperature conditions, while eliminating the incidence of structural failure of the wafer due to thermal expansion and contraction stress. There is a need for a wafer testing apparatus and method that supports rapid and direct cooling of wafers to cryogenic temperature conditions, in order to improve the efficiency of the wafer testing process. There is a need in the art for systems that provide quality magnetic shielding and cryogenic conditions in the same test chamber. And there is a need in the art for improved dry wafer testing systems that reduce the consumption of expensive coolant materials.

SUMMARY OF THE INVENTION

The scope of the invention encompasses novel systems, devices, and methods, which enable high throughput and high-quality testing of wafers under magnetically shielded cryogenic conditions. The systems of the invention provide greatly improved throughput, higher quality testing conditions, and substantially reduced testing costs.

In a first aspect, the scope of the invention encompasses a novel wafer testing apparatus or "probe station." Prior art probe stations systems suffer from poor (or lack of) magnetic shielding and inefficient maintenance of cryogenic conditions at very low temperatures, such as at around 4K. The novel probe stations of the invention provide, in certain embodiments, a magnetically isolated shell within which a testing system may be maintained at the desired cryogenic temperatures. In some implementations, the novel probe station systems of the invention utilize concentric thermal buffer zones to enclose the test environment and to maintain it at tightly controlled cryogenic temperatures, optionally while also providing excellent magnetic shielding. In the probe stations of the invention, the wafer can be moved with great precision within the testing chamber by connection to movement systems. The maintenance of the desired cryogenic and magnetically shielded conditions is aided by "floating shields" that maintain the chamber temperature and magnetic isolation while enabling precise movement of wafers for effective testing by probe stations.

In another aspect, the scope of the invention is directed to novel methods of directly cooling a wafer for testing under cryogenic conditions. The novel methods of the invention enable the testing of bare wafers, without the need for carrier structures or adhesives. The direct cooling of bare wafers by the devices of the invention enables vastly improved throughput and avoids the problem of shattering wafers. The novel systems of the invention enable direct cooling of bare wafers by the use of novel receiving elements located within a cryogenic isolated environment, which hold the wafer in place during testing without thermal shock induced breakage of the wafer.

In another aspect, the scope of certain embodiments of the invention are directed to maintaining a flat and level surface within a vacuum environment. With the use of novel combinations of materials, the novel systems of the invention enable the testing of wafers on precision actuators or motion systems which depend on a sufficiently flat surface, while under cryogenic and vacuum conditions.

In another aspect, the scope of the invention encompasses novel dry wafer testing systems, wherein the a flexible, thermally conductive strap connects the mobile and static stages of the testing device, with large coolers operating on the static stages. The use of such elements is challenging as it places opposing requirements on the straps: to be conductive they should be thick, short and made of high conductivity materials such as pure copper or pure aluminum; while to be flexible, they should to be long, thin, and made stronger materials. The resulting design problem is quite challenging and prone to subtle failure modes such as work-hardening of the straps leading to decreases in thermal conductivity. The inventors of the present disclosure have advantageously determined that certain flexible materials which experience a drastic increase in thermal conductivity over critical temperature ranges can be used as the strap material. In the novel dry systems of the invention, the straps comprise materials such as pure alloys of copper and aluminum and are cooled to a temperature range of about ~15-25 K, resulting in a substantial increase in thermal conductivity. Such implementations solve the flexibility vs. thermal conduction problem, enabling the use of thinner straps having sufficient flexibility to enable the wide range of motion needed in a wafer testing system.

The various devices, systems, and methods of the invention are described in detail next.

BRIEF DESCRIPTION OF THE DRAWINGS

FIG. 20A is an upper perspective view of a vacuum vessel plate attached to a base in certain embodiments of the invention, identifying the area for flattening. FIG. 20B depicts an upper perspective view of a vacuum vessel plate attached to a base in certain embodiments of the invention, marking the grid for flattening. FIG. 20C depicts a view of the grid for flattening the base.

DETAILED DESCRIPTION OF THE INVENTION

Figure 1:
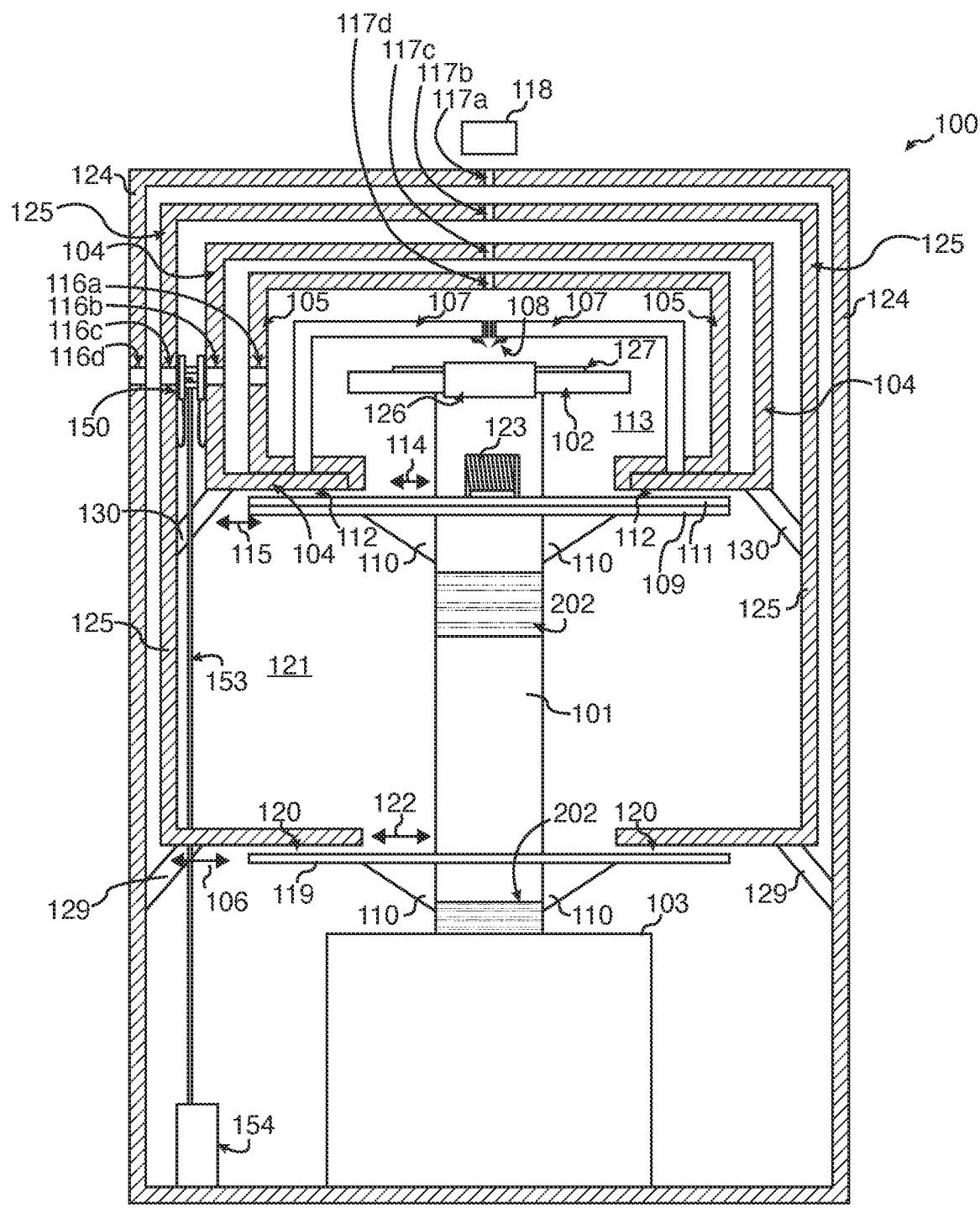
FIG. 1 depicts a side cross-sectional diagram of the testing apparatus in certain embodiments of the invention.

The various inventions disclosed herein encompass novel and improved devices for the testing of electronic components under tightly maintained cryogenic conditions, and, optionally, under magnetically shielded conditions, the systems being herein referred to a "probe stations."

The various probe stations and components thereof disclosed herein may be described with reference to the Figures. Below is a numeric key listing the structures, components, and elements denoted by the various numbers in the Figures:

- 100: apparatus
- 101: central vertical column
- 102: chuck
- 103: motion stage
- 104: test zone casing
- 105: magnetic shield casing
- 106: horizontal gap
- 107: bridge
- 108: probe card
- 109: first floating shield
- 110: struts
- 111: a magnetic shielding layer
- 112: vertical gap
- 113: test zone
- 114: movement radius
- 115: horizontal gap
- 116*a*, 116*b*, 116*c*, 116*d*: gated slots
- 117*a*, 117*b*, 117*c*, 117*d*: optical openings or windows
- 118: optical elements
- 119: second floating shield
- 120: vertical gap
- 121: second thermal buffer zone
- 122: movement radius
- 123: cooling elements
- 124: outer housing
- 125: thermal buffer casing
- 126: clamping element
- 127: wafer
- 129 and 130: structural members
- 150: door assembly
- 151: first door
- 152: second door
- 153: support rod
- 154: actuator
- 155: insulating elements
- 156*a* and 156*b*: thermal strip
- 157: springs
- 159: insulating element
- 201: service lines
- 202: thermal insulator material
- 203: inlet port
- 204: outlet port
- 300: clamps
- 301: vertical supports
- 302: springs
- 303: openings
- 304: push bar
- 305: platform
- 306: cross member
- 307: wafer delivery arm
- 308: bellows
- 309: bellows
- 310: Upper lip of bellows
- 311: Lower lip of bellows
- 400: base
- 401: vacuum vessel plate
- 402: adjustable foot
- 403: fastener
- 404: load spreading plate
- 405: stud
- 406: stud first end
- 407: stud second end
- 408: washer
- 409: nut
- 410: vacuum vessel plate first surface
- 411: vacuum vessel plate second surface
- 412: through opening
- 413: fastening hole
- 414: bolt
- 415: fastener first end
- 416: base first side
- 417: fastener second end
- 418: base second side
- 500: area for flattening
- 501: grid
- 502: reference surface
- 503: dial indicator
- 504: support block
- 505: reference block
- 506: relative distance
- 601: Base Structure
- 602: Motion system
- 603: Intermediate temperature mobile stage

604: Low temperature mobile stage
605: Wafer Chuck
606: Gate Valve
607: Outer Housing
608: Intermediate Temperature Static Shell
609: Thermally insulating supports
610: Low Temperature Static Shell
611: Windows
612: Low Temperature capable two-stage cryocooler
613a and 613b: Temperature stages a and b of the cryocooler
614: Low Temperature Thermal link
615: Low Temperature Thermalization Block
616: Low Temperature Flexible Strap
617: Intermediate temperature Cryocooler
618: Low temperature stage
619: Intermediate temperature link
620: Intermediate temperature thermalization block
621: Intermediate temperature flexible thermal strap
700: Thermalization Block
701: Flexible thermal link
702: Mobile stage cross section in center of range of motion
703: Flexible thermal link at one extent of motion
704: Mobil stage cross section at one extent of motion
800: Mobile stage
801: Flexible thermal composed of foils
802: Static Thermalization Block The novel structures disclosed herein may be fabricated from any number of materials. It will be understood that the devices described herein are not limited to any specific materials and one of skill in the art may select materials suitable for the ultra-low temperature (and, in some embodiments, magnetically shielded) operations described herein. Various materials recited herein are referred to as "high purity" materials. Exemplary high purity materials may include materials of 99% purity, 3N (99.9% purity), 4N (99.99% purity), 5N (99.999% purity), and 6N (99.9999% purity). Various metals are recited herein as well as their "alloys." As used herein, alloys may encompass materials that are primarily of a recited metal in combination with other metals (for example, an "aluminum alloy" may comprise mostly aluminum in combination with other metals), as known in the art. Reference to steel alloys may include, for example, steel alloys 304 and 310, and alloys comprising chromium and/or nickel. For example, steel alloys may comprise a nickel content between 20% and 25% and may further comprise cobalt, molybdenum, titanium, aluminum, or niobium. Aluminum alloys may comprise, for example, 2000 and 5000 series alloys, 1100, 2014, 2024, 2219, 3003, 5083, 5456, 6061, 7005, 7039, 7075, 5083-O, 2219-T87, 5052-H38, 5083-1138, 2024-T6, 7039-T6, 2219-T87 and 6061-T6. Nickel alloys may include, for example, alloys containing nickel in combination with copper, iron, manganese, carbon, and silicon, for example, Monel, K-Monel, electroformed nickel, hardened nickel, Inconel X, Inconel 718, René 41, and Hastelloy B. Copper alloys may include, for example, 70-30 brass, copper-beryllium, iron-silicon and aluminum bronzes.

The various elements of the probe station systems of the invention are described in detail next.

Outer Housing. A first element of the probe station is the outer housing. The outer housing encloses the various elements of the system, provides thermal insulation to the component testing zone, and in some embodiments, defines a vacuum chamber in which the elements of the invention are surrounded. The housing comprises a containment vessel. In a primary embodiment, as in the exemplary probe station of the invention depicted in FIG. 1 and FIG. 2, the housing 124 comprises a cylindrical container, however a cubic housing, rectangular box, or other dimensioned housings are within the scope of the invention.

The outer housing provides a barrier between the exterior ambient conditions and the components within. In some embodiments, the outer housing defines a vacuum chamber, wherein a vacuum is created and maintained within the chamber defined by the housing. The outer housing may include ports or other physical elements that connect elements within the interior of the housing to components outside the device. For example, the outer housing may comprise one or more ports that are connected to a vacuum source, one or more ports for tubing to conduct liquid cryogens into and out of the device, and one or more conduits or wires connecting the probe card, motion stage, door actuators, chuck actuators, and other elements to power sources and processors or control and data collection components located outside the device.

In one embodiment, the outer housing comprises a vacuum boundary material and design capable of maintaining an internal vacuum and withstanding outside pressures. Exemplary outer casing materials include metals such as aluminum, stainless steel, and alloys thereof, for example a single layer of aluminum having a thickness of 2-15 mm. In certain embodiments, the outer housing additionally comprises a magnetic shielding material, to redirect ambient magnetic fields away from the interior of the housing.

The outer housing may comprise a removeable lid, a door, or other structure that enables access to the components on the interior. The outer housing also comprises a gated slot, i.e. a slot and associated door that can be actuated to cover and uncover the slot. By this gated slot, the wafer or other component to be tested may be introduced into and withdrawn from the device.

In one implementation, the outer housing comprises a cylindrical body mounted on a solid base and comprising removable circular lid, which may be attached to the top of the cylindrical body by closure elements (latches, bolts, etc.) to create an airtight chamber.

Thermally Defined and Magnetically Isolated Work Zone for Wafer Testing. A primary element of the apparatus of the invention is a testing chamber that can be maintained under tightly controlled conditions, including cryogenic conditions. This testing chamber, referred to herein as the "testing zone," comprises a thermally defined and, optionally, a magnetically isolated chamber, within which multiple elements are contained, as described below.

As used herein, thermally defined means that the elements inside the chamber are maintained at a selected temperature, or within a selected temperature range. In a primary implementation of the invention wherein the test chamber is maintained under vacuum conditions, thermally defined conditions are achieved by the use of thermally conductive elements in contact with or otherwise cooled by one or more cooling elements, as described herein.

The test zone is defined by a casing, referred to herein as the "test zone casing," for its role in defining the area of the test zone and maintaining the desired conditions of the test zone. Referring to the exemplary embodiments depicted in FIG. 1 and FIG. 2, the testing zone 113 is the area within the test zone casing 104. The test zone casing comprises a hollow body comprising an inner space and an outer wall or walls, top surface, and bottom. The test zone casing comprises various openings, including a bottom opening, a top, top optical access opening, and a lateral opening comprising a gated slot.

The test zone casing will comprise a thermal shielding material to resist the ingress of heat from the exterior of the casing. As used herein, a thermal shielding material is a material, including a pure material or a composite or alloy of multiple materials, capable of thermally isolating or insulating an area enclosed by the material. Preferred thermal shielding materials of the test zone casing include materials having high thermal conductivity and appropriate structural strength to withstand extreme cooling. In one embodiment, the test zone casing comprises aluminum, for example, 1100, 3003, 6063, or 6061 type aluminum. Alternative materials include metals such as magnesium, and copper. For example, in one embodiment, the test zone casing comprises 3003 aluminum, or copper. The thickness of the test zone casing may be for example, a thickness of 0.25-10 mm, for example, about 3 mm thick (as used herein, "about" means within 10% of an enumerated value), although other thicknesses may be contemplated. Generally, the test zone casing will comprise a single layer of material however, in alternative implementations, the casing comprises multiple layers.

Figure 2:
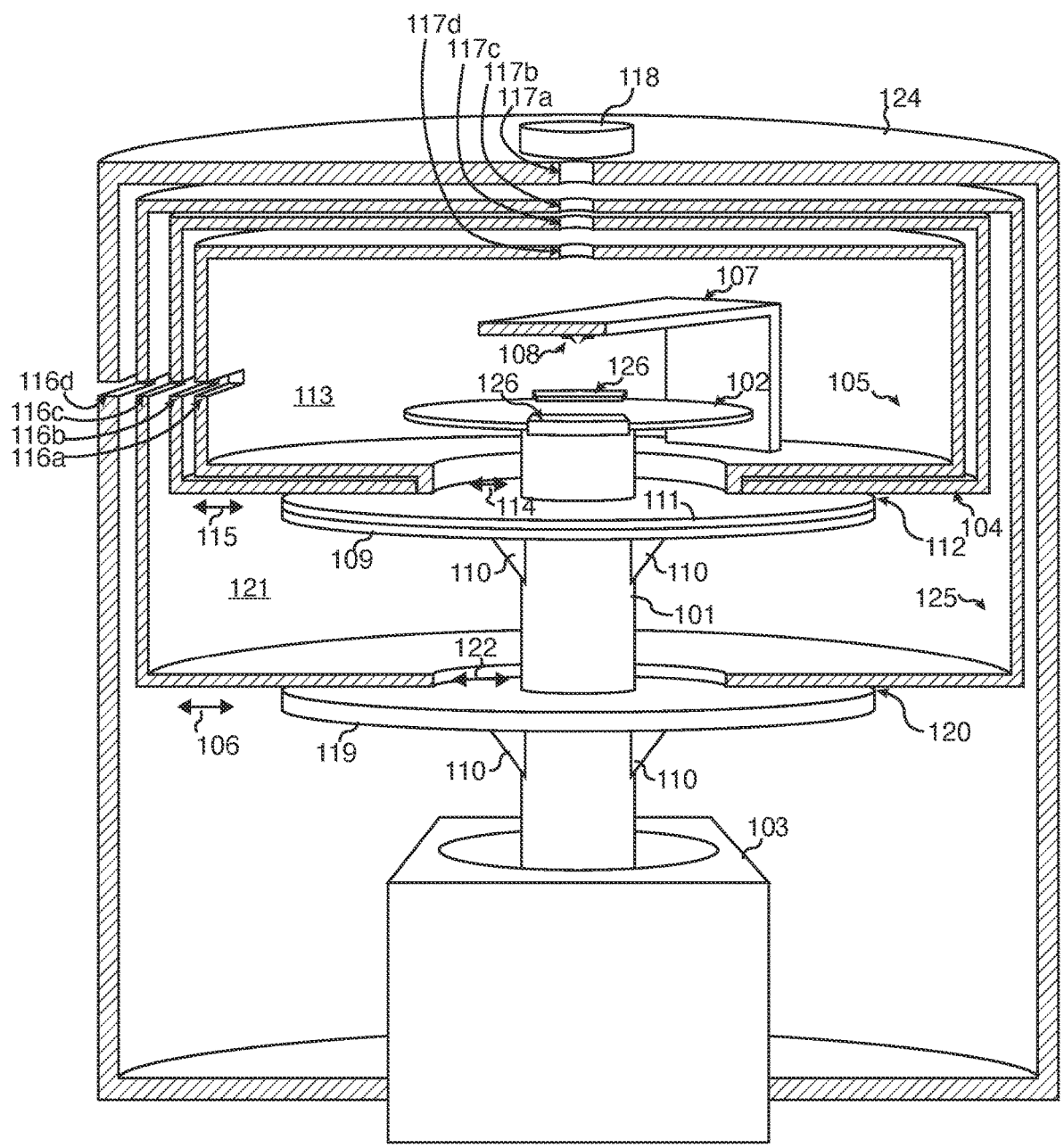
FIG. 2 depicts a perspective cross-sectional diagram of the testing apparatus in certain embodiments of the invention.

In a primary embodiment, the test zone casing will comprise a circular/cylindrical shape, as depicted in FIG. 1 and FIG. 2. However, it will be understood that the test zone casing may assume any shape, such as a cube, rectangular box, triangular box, or irregular shape.

The bottom opening of the test zone casing is covered by a shielding element, as described below. The test zone casing will contain, enclose, or be in contact with one or more cooling elements, also as described below. By the action of the one or more cooling elements, the elements within the test zone may be maintained at tightly controlled thermal conditions, within any selected temperature range between the base temperature of the device and room temperature. In a primary embodiment, the test zone casing 104 is maintained at a cryogenic temperature, for example at a temperature of 0K to 6K, for instance, at about 4K.

Magnetic Isolation. In certain embodiments of the invention, successful testing of the electronic components requires an environment substantially free of ambient or other magnetic fields and fluxes. In such cases, the probe station may be configured to have a magnetically isolated test zone. This is achieved by the use of a casing referred to herein as the magnetic shield casing. The magnetic shield casing is a hollow structure disposed inside the test zone casing. The magnetic shield casing comprises a bottom opening, which is aligned with the bottom opening of the test zone casing.

To maintain thermally defined temperatures, the magnetic shield casing is cooled by thermally conductive connections to the test zone casing along one or more surfaces, for example, the bottom surface, as depicted in FIG. 1 and FIG. 2. In one embodiment, the magnetic shield casing is connected to the inner surface of the test zone casing by struts, beams, or other thermally conductive support structures. In one configuration, the magnetic shield casing and the test zone casing in which it sits will be composed of differing materials having different coefficients of thermal expansion. In such embodiments of the invention, one or more thermally conductive members that has flexing properties may optionally be utilized to connect the test zone casing 104 and the magnetic shield casing 105. In one embodiment, the magnetic shield casing sits upon (or is connected to, e.g. by welds or screws) to the bottom surface of the test zone casing, for example, as depicted in FIG. 1 or FIG. 2. In one embodiment, the magnetic casing comprises an inner layer of material lining the inner surface of the test zone casing.

The magnetic shield casing may comprise any shape, however, it will generally be advantageous to have the same shape as the test zone casing in which it sits. For example, referring to the exemplary embodiment depicted in FIG. 1 and FIG. 2, the magnetic shield casing 105 comprises a cylindrical shape, concentrically located within the cylindrical test zone casing.

The magnetic shield casing may comprise any number of magnetic shielding materials, i.e. materials that redirect or attenuate magnetic fields and which can protect an area enclosed by the material from external magnetic fluxes. Magnetic shielding materials include, for example, ferromagnetic materials including iron alloys, nickel-iron alloys, and nickel-iron-molybdenum alloys. Exemplary materials include ASTM A753 Alloy Type 4, ASTM A753 ALLOY 2, MIL-N-14411 Composition 1, supermalloy, supermumetal, nilomag, sanbold, molybdenum. Commercially available materials include, for example, MUMETALS™ (Holland Shielding Systems, Dordrecht, Netherlands), or CRYOPERM™ (MuShield, Londonderry New Hampshire, USA) and ALLOY49™. Wall thickness of the magnetic shield casing may be of any thickness suitable for effective magnetic shielding of the interior space enclosed thereby, for example, in the range of 0.2-4.0 mm.

The bottom openings of the test zone casing and magnetic shield casing will generally be of about the same size and shape (e.g., diameter). In some embodiments there is a mismatch in size, wherein the smaller of the two bottom openings will define the lateral range of the column, as described below.

Being within the test zone casing and in thermally conductive connection thereto, the magnetic shield casing is maintained at the cryogenic conditions of the test zone casing. The magnetic shield casing thus defines a magnetically isolated, thermally defined chamber or test zone. The testing of electronic components is performed within this chamber, where high quality measurements may advantageously be achieved.

In an alternative implementation, the wafer testing apparatus of the invention does not require substantial magnetic isolation of the test zone. In this alternative implementation, the magnetic shield casing is entirely omitted from the device and the test zone is defined only by the boundaries of the test zone casing.

Probe Card. One or more probes, or probe cards, are located in the test zone. A probe card is an array of probe elements (e.g. contacts or needles) that contact devices on a wafer or other tested device for measurement of conductivity, performance, etc. The probe card is in electrical connection with, and can be engaged by, one or more exterior devices comprising a computerized controller. When engaged, the contacts of the probe card touch the test substrate at target contact points, the probe card delivers electrical input signals to the test substrate, and the probe card receives electrical output signals from the test substrate. The probe card is connected by wires to external components such as control systems, power supply, regulator, and signal processing/storage devices that enable the electrical stimulation of contacts and/or measurement of output signals, the wires passing through any intervening casings by openings or conduits.

The probe card may be suspended within test zone by one or more structural elements, for example, by being connected to points on the inner surface of the test zone casing, for example, with beams, pillars, or other elements wherein such support structures are thermally conductive and are in connection with the test zone casing. In one embodiment, the structural element comprises a support element or a bridge 107 that is anchored at each end by vertical elements that pass through the magnetic shield casing, if present, and are connected to the inner face of the bottom surface of the test zone casing, for example, as depicted in FIG. 1 and FIG. 2.

Wafer Holding Elements. The electronic component to be tested may be any electronic component, for example, a component comprising a device or multiple devices. To initiate testing, the electronic component is introduced to the test zone. In a primary implementation, the electronic component is wafer, for example, a wafer comprising multiple devices, for example, laid out in a grid.

The test zone will comprise a receiving element for the electronic component. In the case of a wafer to be tested, the receiving element may comprise a chuck. The chuck comprises a platform having a substantially planar body with a flat upper surface, upon which the wafer to be tested will sit and be held in place. The material of the platform is ideally a pure metal or alloy with high stiffness, high thermal conductivity, and non-magnetic properties. Examples include copper, aluminum, molybdenum, and their alloys. In one implementation, the electronic component to be tested comprises a circular wafer, and the chuck comprises a substantially circular surface for receiving the wafer.

The chuck comprises one or more clamping elements hold the wafer 127 at its edges. Actuation of the clamping element is achieved by one or more rods, for example, a push bar, or other elements, for example, an actuator and push bar present inside the central column, which is described below. The motorized actuators may be in connection with external power sources and control components via wires. For example, in one embodiment, the chuck comprises clamping elements, for example, 2, 3, 4, 5, or more spring-tensioned clamps that can be lifted by a central actuation rods to create a receiving space for the wafer, and which can be released after introduction of the wafer, wherein, by the spring tension, they will retract downwards and clamp the wafer to the chuck surface.

Figure 5A:
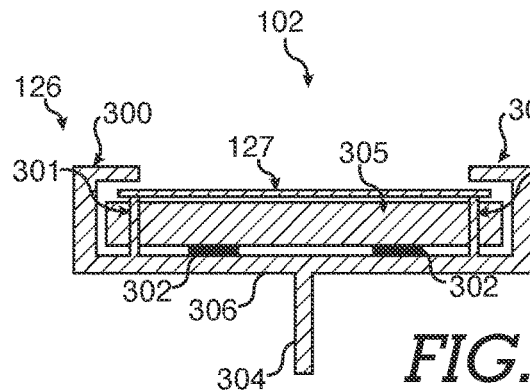
FIG. 5A depicts a side sectional view of an embodiment of the chuck in an open position.
Figure 5B:
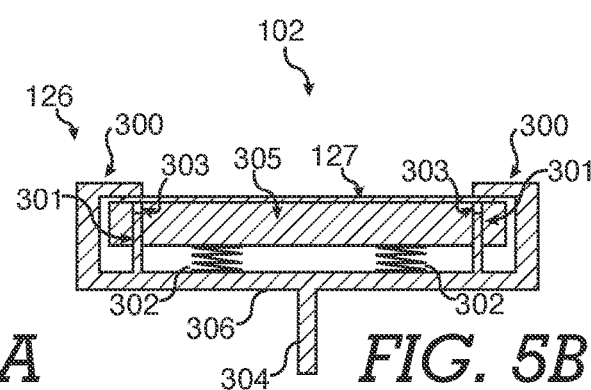
FIG. 5B depicts a side sectional view of an embodiment of the chuck in a closed position.
Figure 6A:
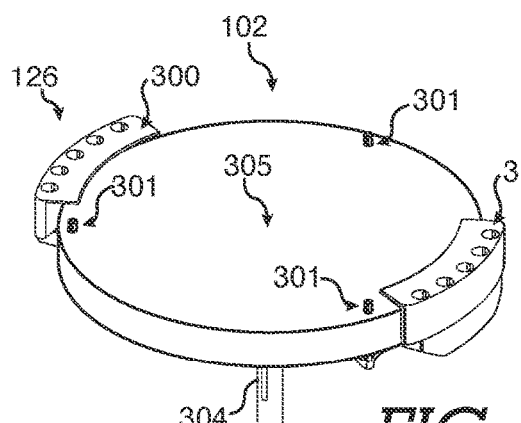
FIG. 6A depicts a perspective view of an embodiment of the chuck in an open position.
Figure 6B:
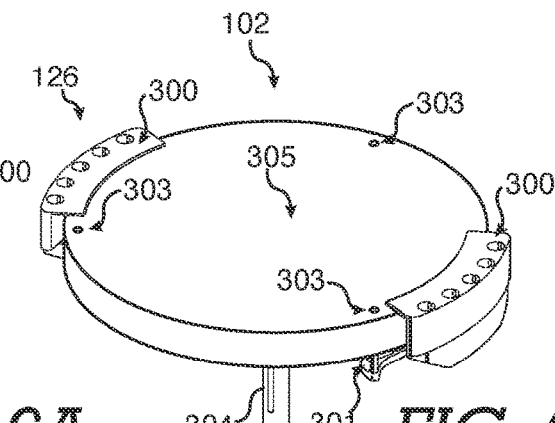
FIG. 6B depicts a perspective view of an embodiment of the chuck in a closed position.
Figure 7:
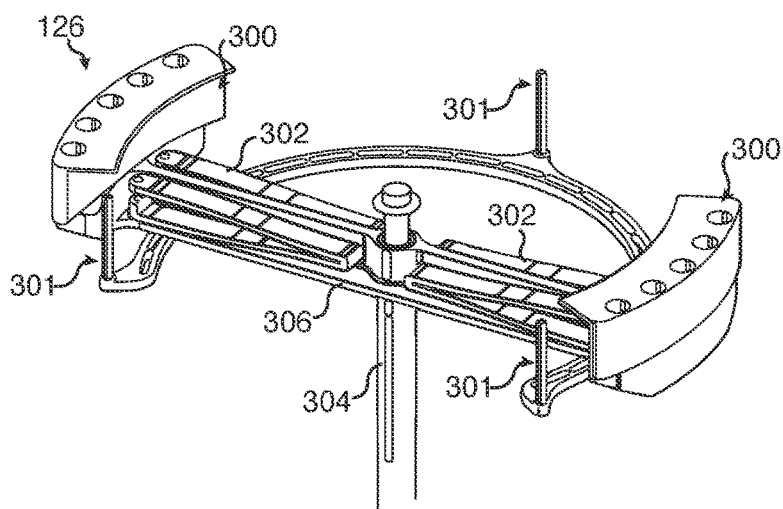
FIG. 7 depicts a perspective view of the chuck in certain embodiments.

In certain embodiments of the invention, the chuck 102 comprises one or more actuatable clamping elements 126 that hold the wafer 127 or other test piece in place during the testing process, for example, as depicted in exemplary embodiments found in FIGS. 5A, 5B, 6A, 6B, 7, 8A, 8B, 8C. The clamping elements 126 includes a clamp 300 attached to a cross member 306, where the cross member is disposed below the platform 305. Springs 302 make contact between the cross member and the platform. Referring to FIG. 6B, a plurality of vertical supports 301 is connected to the cross member 306, and pass through openings 303 located on the platform 305.

Referring to FIGS. 5A, 6A, 8A, and 8B, when the push bar 304, attached to the cross member 306 is lifted upwards relative to the platform 305, the springs 302 are compressed, and opens a space between the clamp 300 and the platform 305 for delivery of a wafer 127. The wafer may be introduced, for example, with a wafer delivery arm 307 of an externally located wafer feeding system. The supports 301 are generally oriented in a vertical direction, and are connected to the cross member 306. When the push bar is lifted upward, the vertical supports are exposed above the surface of the platform 305. The vertical supports 301 support the wafer, and provide a space between the wafer 127 and the platform 305, for example, while loading the wafer 127 into the chuck, as shown in exemplary FIG. 8A. In certain embodiments of the invention, a motorized actuator is located in the central column below the chuck, for example, at the bottom of the central column and is connected to and operates the clamping elements of the chuck via the push bar which extends through the column. The actuator may be in connection with and operated by control systems external to the outer housing.

Figure 8A:
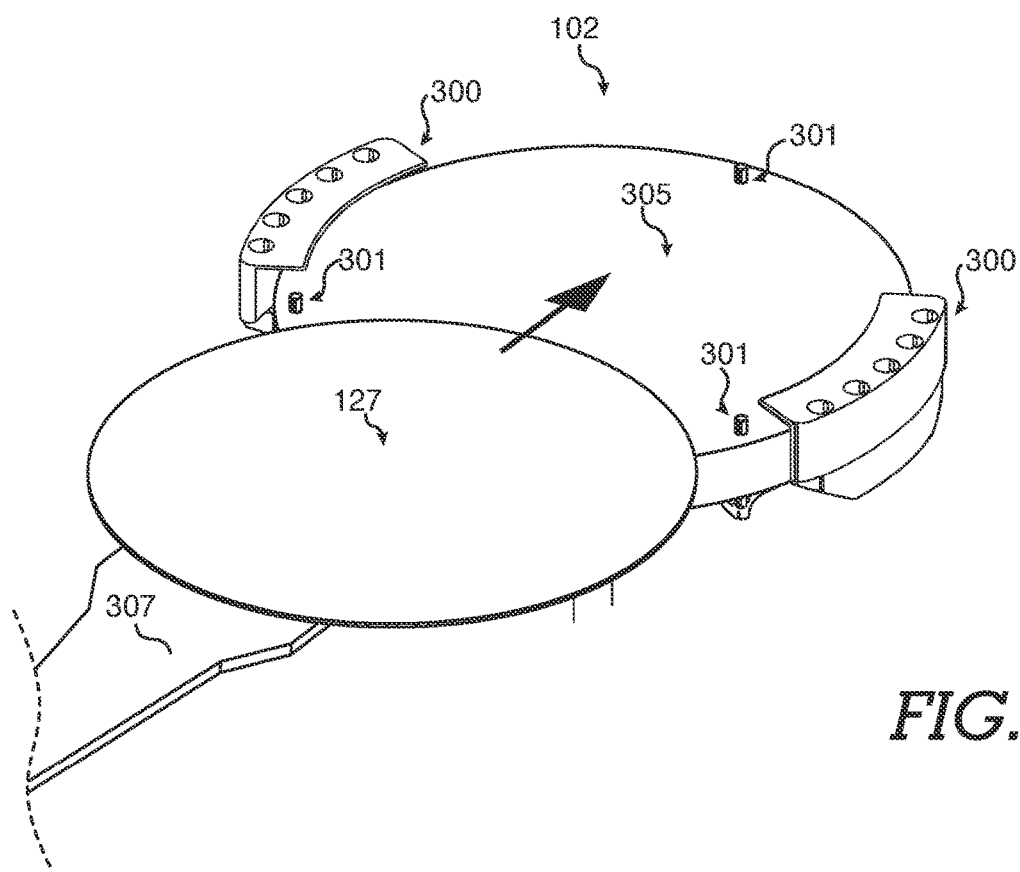
FIG. 8A is a perspective view of a wafer being inserted onto a chuck, in certain embodiments of the invention.
Figure 8B:
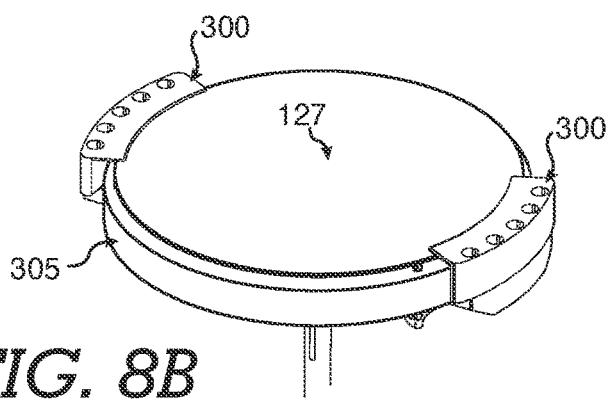
FIG. 8B is a perspective view of a wafer on the chuck before being clamped, in certain embodiments of the invention.
Figure 8C:
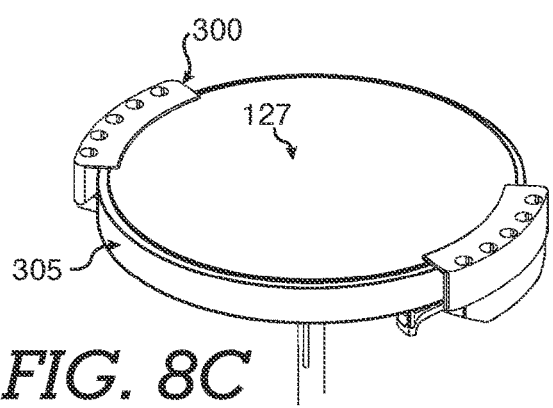
FIG. 8C is a perspective view of a wafer clamped onto the chuck, in certain embodiments of the invention.

Referring to FIGS. 5B, 6B, and 8C, when the push bar 304 is released, the springs 302 located between the platform and cross member, places a force upon the cross member 306. Lowering of the cross member, and thus the clamping element which is attached to the cross member, results in the clamps 300 providing a downward force against a wafer 127 placed on the platform 305. Simultaneously, the vertical supports 301 are lowered, which lowers the wafer onto the surface of the platform 305. In this manner, the wafer 127 is clamped between the clamps 300 and the platform 305.

Advantageously, the wafer clamping elements and chuck of the invention are located within the controlled cryogenic environment of the test zone. Accordingly, shrinkage of the metal making up the chuck elements is minimal during the wafer introduction and testing process, minimizing or eliminating substantial compressive stress on the wafer. In contrast, in prior art wafer cooling systems, a wafer is clamped or adhered to a holding element while external to the device, which then must be introduced to the cryogenic work zone. This creates a conflict between too much clamping force causing compressive stress and wafer shattering with too little clamping force causing poor thermalization of the wafer. Thus, the prior art process requires substantial time and risk, while the process of the invention, wherein the wafer is rapidly cooled on an already-cooled holding device, results in greatly increased throughput and safety. The introduced and clamped wafer will shrink as it is rapidly cooled in the test zone, creating tensile stress, however, the inventors of the present disclosure have discovered that silicon wafers are generally able to tolerate this stress without cracking or shattering.

Precision Movement of the Wafer. In order to successfully test a circuit or other electronic component, the target contact points of the component must be placed precisely under the contacts of the probe card. In the case of a wafer, after a circuit is tested, the wafer must be repositioned under the probe card such that another circuit is presented to the probe card, again with precise positioning of target contact points under the contacts. Accordingly, the wafer must be positioned under the probe card with very high precision, for example with tolerances in the range of 1 to tens of microns. The wafer probe station of the invention is capable of high precision alignment of the probe card and test substrate.

In order to control the position of the wafer with respect to the probe card, it is advantageous to enable visualization of the wafer and probe card in the test zone from the exterior of the probe station. Visualization of the work zone by instruments located outside the housing may be enabled by an aligned series of openings or windows comprising transparent materials, in the various casings. The windows may comprise glass, sapphire, or other transparent material. For example, in the exemplary embodiment depicted in FIG. 1 and FIG. 2, the probe station comprises an outer housing 124, a thermal buffer casing 125, a test zone casing 104, and a magnetic shield casing 105, wherein the wafer and probe card are visualized by optical elements 118 on the exterior of the outer housing via a series of aligned optical openings or windows 117*a-d*. Such visual monitoring systems may comprise, for example, a CCD or CMOS camera in connection with computerized control elements in order to guide the actuation of the wafer to selected positions under the probe card.

Guided by the control system, the wafer must be moved with great precision to a selected point under the probe card. This is achieved in the systems of the invention by the novel use of a motion stage system. The motion stage is located inside the outer housing 124, but outside of the challenging thermal environment of the test zone and is connected to the chuck residing within the test zone by a vertical column. The lower end of the column is connected to a motion stage 103. The motion stage comprises a motorized system for effecting fine movements of the column, for example with precision in the range of 1-100 microns. In certain embodiments, the motion stager is configured to move the column laterally, vertically, and rotationally, with high precision. Exemplary motion stage systems include commercially available precision, vacuum compatible motion stages. Commercially available examples of such motion stages include those provided by NEWPORT CORPORATION™, and PI MICOS™.

The location of the movement system outside the magnetically isolated cryogenic work zone requires that the work zone be accessible by the column. Further, it is advantageous for the column to have a substantial lateral range of movement, such that the full working surface of the wafer or other component can be moved beneath the probe card. The bottom opening of the test zone casing (and bottom opening of the magnetic casing, if present) enables this lateral range of movement. The width of the bottom opening of the test zone casing, and/or the width of the bottom opening in the magnetic shield casing, will be selected such that the entire working surface of the wafer (containing the devices to be tested) is accessible by the probe card, which is achieved through the lateral movement of the column. For example, in the case of a circular wafer and a round bottom opening in the test zone casing, the distance between the outer surface of the column and the edge of the bottom opening of the test zone casing (or magnetic shield casing, if present and smaller), will be about the diameter of the working area of the wafer, plus the diameter of the column. For example, in the case of a 200 mm wafer with a 2 mm exclusion zone at its perimeter and a column having a diameter of 40 mm, the bottom opening of the first casing will have a diameter of at least 236 mm.

Floating Shields. Relatively large openings in the bottom of the test zone casing (and magnetic shield casing, if present) are required to achieve a larger lateral range of column movement. This presents a potential problem for maintaining the integrity of the magnetic shielding and thermal isolation of the work zone. To address this issue, the scope of the present invention encompasses the use of novel shielding elements which thermally shield the bottom openings(s) of the casing(s) defining the test zone while enabling wide lateral movement of the central column. In a primary embodiment, the shielding element comprises a "floating shield." The floating shields of the invention comprise planar structures disposed around the central column which are parallel to the bottom surface of a casing, and which provide coverage of the bottom opening of such casing during lateral actuation of the column. The floating shields of the invention are sized such that the bottom opening of the associated casing is entirely covered by the floating shield throughout the entire lateral range of motion of the column. These floating shields serve to block thermal radiation from outside the casing.

By vertical actuation of the column, the floating shields may also be raised such that the gap between the bottom surface of the associated casing and the top surface of the floating shield is minimized, to seal or substantially seal the interior of the casing. In some implementations, the top surface of the floating shield contacts the bottom surface of the associated casing. In other implementations, the gap between the top surface of the floating shield and the bottom surface of the associated casing may be reduced to about 1 mm or less, for example, 0.1 mm or 0.5 mm, by raising the column.

The floating shield comprises a planar aspect, for example, a disc-shaped body. The floating shield is affixed to the column, oriented substantially perpendicular to the longitudinal axis of the column. In certain embodiments of the invention, the floating shield is supported by support elements, such as struts 110, as shown in FIG. 1 and FIG. 2, or spars, ties, or angled elements assisting the support of the floating shield by the column. A primary function of the floating shield is maintaining the thermal isolation of the chamber above, and the shield will comprise materials capable of insulating the chamber above, for example, metals such as aluminum, steel, copper, alloys thereof, and generally materials having high thermal conductivity. For example, the shield may comprise a layer of aluminum having a thickness of 0.25-5.0 mm. In some implementations the planar structure of the floating shield comprises the same material as the casing that it seals.

In certain embodiments of the invention, the probe station apparatus includes more than one floating shield, for example, a first floating shield for enclosing a test zone, e.g. the test zone chamber, and a second floating shield for enclosing a second thermal buffer chamber, e.g., a 50K chamber, as described below.

The topmost floating shield covers the bottom opening of the test zone chamber. In those embodiments wherein a magnetic shielding casing is present within the test zone chamber and wherein magnetic shielding of the work zone is desired, the topmost surface of the floating shield will comprise a magnetic shielding material to achieve optimal magnetic isolation of the test zone.

Referring to FIGS. 1, 2, 4, 9A, 9B, in one implementation, the floating shield comprises for example, a first layer 109 that comprises a thermally conducting material, and a second layer 111 comprising a magnetic shielding material. In some implementations, the top surface of the first floating shield comprises a magnetic shielding layer. Examples of materials for magnetic shielding include, for example, ferromagnetic materials including iron alloys, metals having high permeability including nickel-iron alloys. In certain embodiments of the invention, the thickness of the magnetic shielding layer is any thickness suitable for effective magnetic shielding, for example, in the range of 0.5 to 5.0 mm. In certain embodiments of the invention, the magnetic shielding layer 111 sits directly upon the top surface of the planar thermal shield 109. The first layer and second layer of the floating shield may be joined thereto by fasteners, such as screws, bolts, or other fastening elements. In certain embodiments, thermal shielding layer of the floating shield and the magnetic shielding layer of the floating shield will have dissimilar thermal coefficients of expansion. In such implementations, the physical connections between the layers may configured to accommodate differential rates of shrinking and expansion by the thermal and magnetic shielding layers of the floating shield, for example by flexures or slots that prevent warping or over-stressing the assembly during expansion and contraction.

Figure 10:
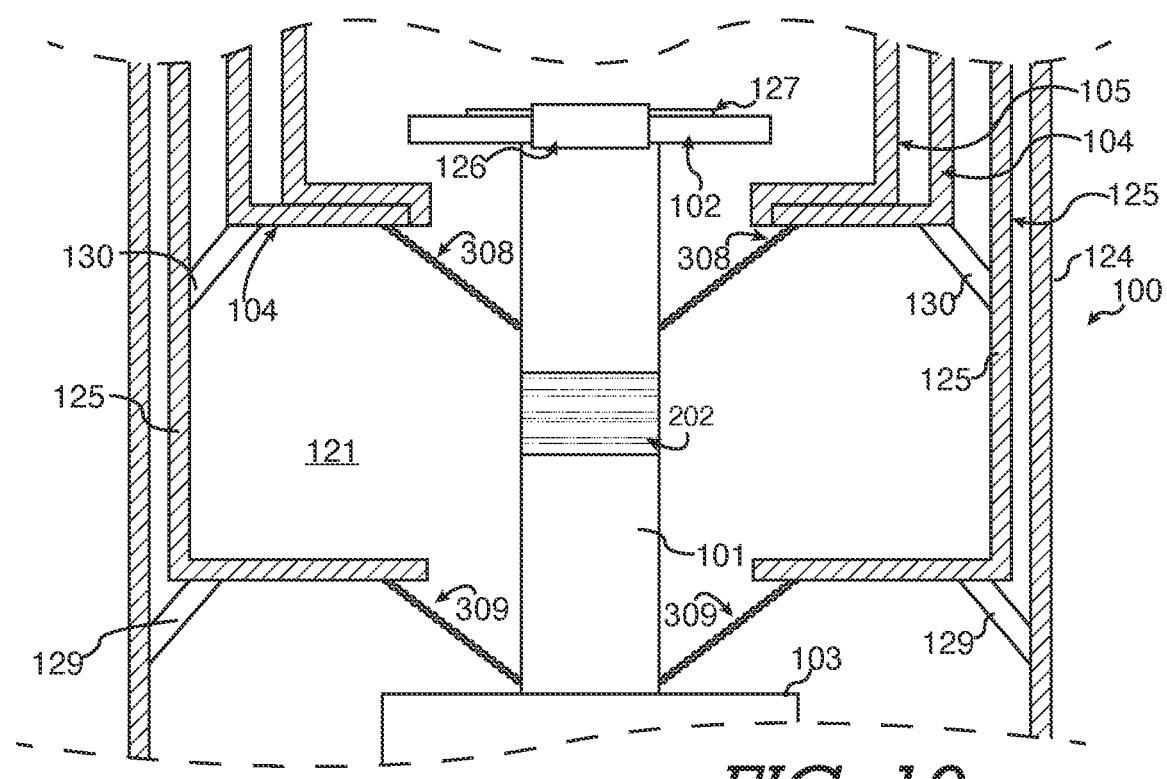
FIG. 10 depicts a side cross-sectional diagram of an exemplary testing apparatus in certain embodiments of the invention.
Figure 25:
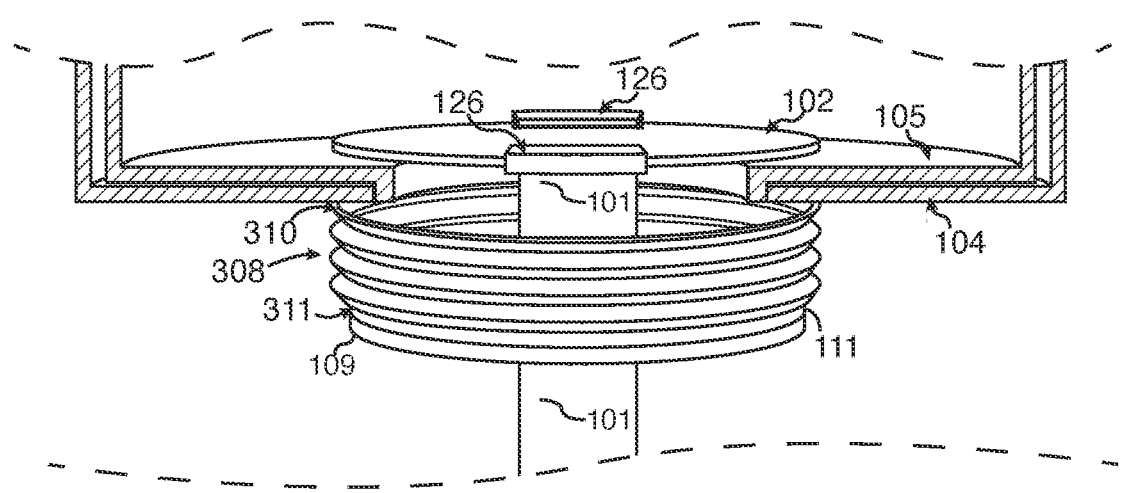
FIG. 25 depicts a flexible bellows of the invention, comprising a top lip and bottom lip, wherein the top lip may be connected to a casing to surround and thermally shield its bottom opening and the bottom lip may be affixed to a floating shield or central column.

Compliant Bellows. In an alternative implementation, the shielding element which shields the bottom opening of a casing comprises a compliant bellows, for example, a compliant bellows that encircles the bottom opening of a test zone casing and/or a thermal buffer casing. An exemplary bellows is depicted in FIG. 25. The bellows will be a compliant structure that can expand or contract, for example, a device with concertinaed, accordion, or pleated sides to allow its top lip and bottom lip to be displaced laterally by expansion and contraction. The bellows will be of sufficient flexibility and size to cover the bottom opening of a casing and enable movement of the column across its lateral range of motion. The bellows may be substantially tubular, having a top diameter or width substantially equal to its bottom diameter or width. Alternatively, the bellows may be pyramidal, with one opening larger than the other. The bellows will comprise a top opening defined by a top lip 310 and bottom opening defined by a bottom lip 311. The bellows may be affixed by its top lip to the bottom of a casing (e.g. a test zone casing or thermal buffer casing) such that it encircles the bottom opening of the casing, and may be affixed by its bottom lip to a structure below. Attachment of the bellows to other structures may be achieved by brazing, welding, screws, bolts, or other attachment means In one embodiment, the structure to which the bottom lip is affixed is a floating shield. In one embodiment, the floating shield comprises a small flange of smaller diameter than the bottom opening of the casing, to which the bottom lip is affixed. In one embodiment the bottom lip is affixed directly to the central column, for example, as depicted in FIG. 10 and no floating shield is present.

The function of the bellows is to maintain thermal and/or magnetic shielding of the bottom opening of a casing while being configured to enable lateral and/or vertical movement of the column. In some embodiments, the bellow supplements the floating shield by providing an additional vertical dimension of shielding. In some implementations, bellows replaces some or all of the floating shield. The bellows may comprise metal foil (or stacked layers of foil), for example, for example, comprising copper, aluminum, steel, or alloys of the foregoing. Foil thickness may be any that enables sufficient range of motion, for example, 0.25-2 mm in thickness. In one embodiment, the bellows comprises one or more springs coated in foil. In other embodiments, the bellows may comprise a textile material that maintains compliance under cryogenic conditions. Exemplary textiles include woven and non-woven textiles, for example, fiberglass textiles, polyester textiles, glass-polyester composite textiles, glass-epoxy composite textiles, polytetrafluoroethylene, poly(p-phenylene terephthalamide), and other cryogenic textiles known in the art. In one embodiment, the textile comprises a textile coated, impregnated, or metalized with thermal shielding material and/or magnetic shielding material, for example, particles or films comprising thermal or magnetic shielding materials, for example, copper, nickel, or cobalt compositions. One or more layers of material may be deposited onto the textile material.

Figure 9A:
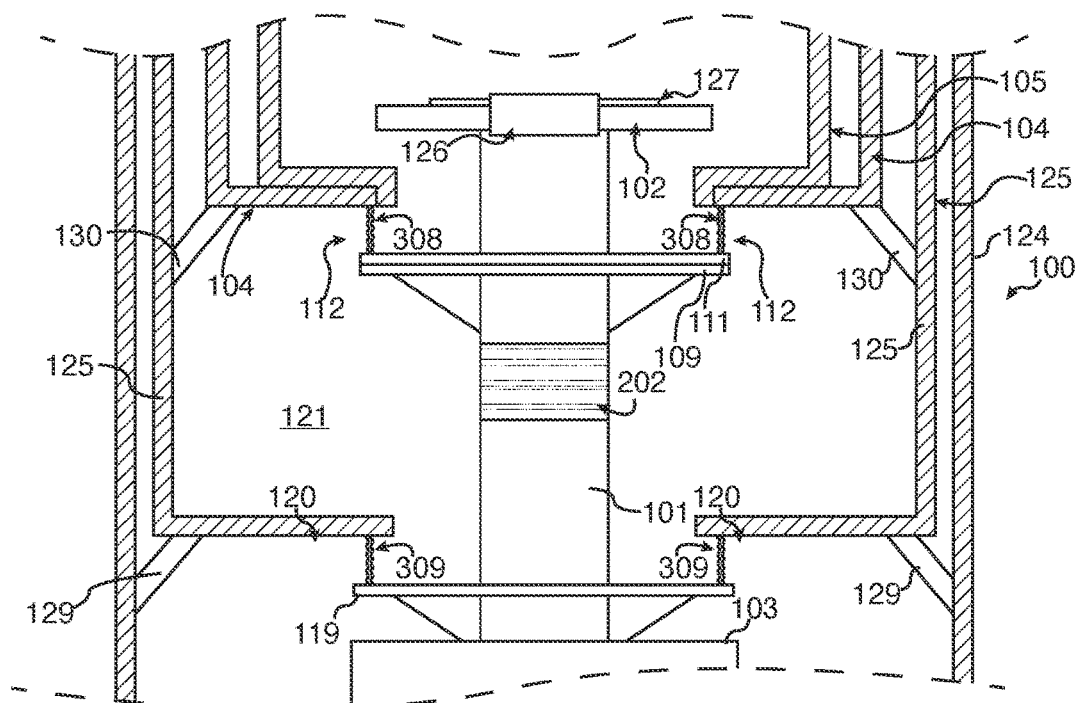
FIG. 9A is a side cross-sectional diagram of the testing apparatus in certain embodiments of the invention.
Figure 9B:
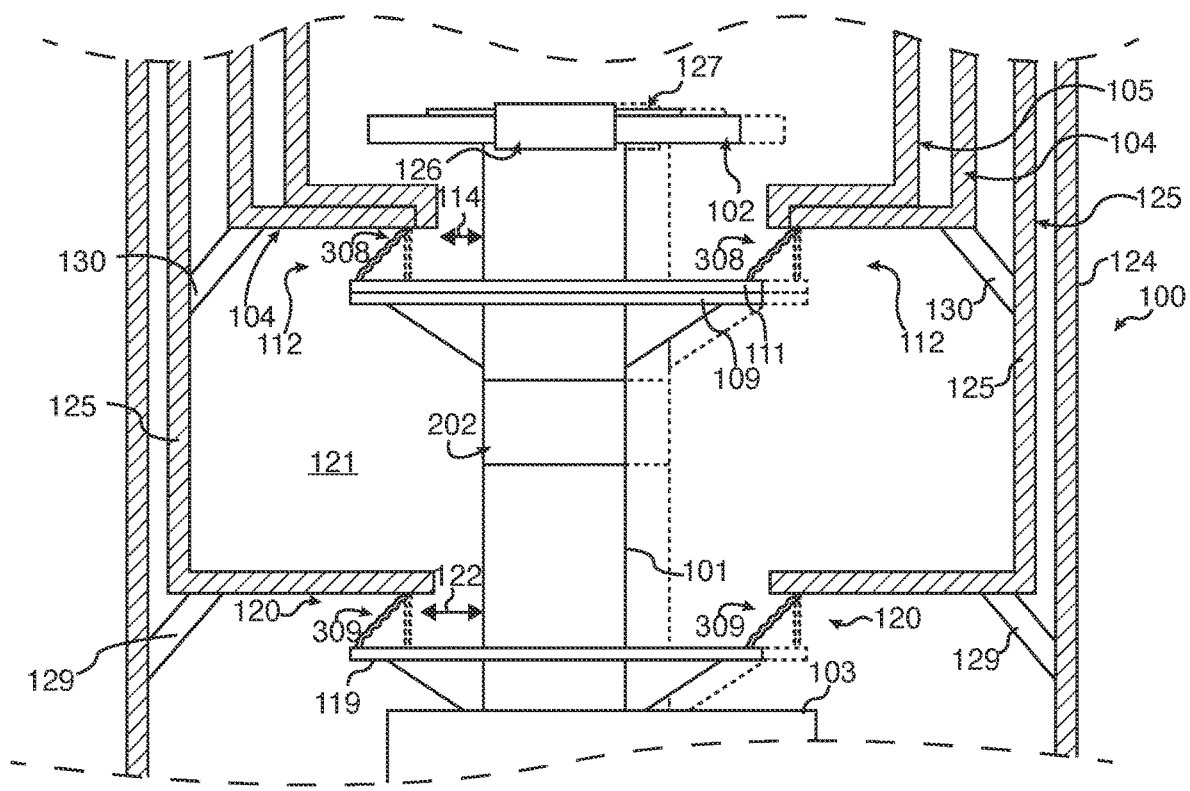
FIG. 9B is a side cross-sectional diagram of the testing apparatus in certain embodiments of the invention.

In operation, the bellows is compliant and undergoes deformation when the column is moved 101, for example, within the movement radii 114, 122 of the floating shield, as seen in FIG. 9B. In certain embodiments of the invention, a two or more bellows are radially oriented around the bottom opening of a casing. Referring to FIGS. 9A and 9B, a bellow 308 is located in the vertical gap 112. In certain embodiments, a bellows 308 is connected between the bottom of the test zone casing 104, such as near the opening of the test zone casing, and the floating shield, such as the magnetic shielding layer 111. In certain embodiments, a bellow 309 is located in the vertical gap 120, connecting the thermal buffer casing 125 and the second floating shield 119.

In certain embodiments, the bellows 308, 309 are connected between the column and the casing above. Referring to FIG. 10, in one embodiment, the bellows 308 connects to column 101 and to a casing above, such as the test zone casing 104. In one embodiment, a second bellows 309 connects a column 101 to the casing above, such as a thermal buffer casing 125.

Thermal Buffer Zones. In one implementation of the invention, the probe station comprises only a single thermally isolated zone, defined by a test zone casing encased within the outer housing. However, in a primary implementation of the invention, the thermal isolation of the test zone is improved by the use of one or more thermal buffer zones. A thermal buffer zone, as used herein, comprises a thermally isolated chamber within which the test zone casing is enclosed. For example, in the exemplary embodiment depicted in FIG. 1 and FIG. 2, the test zone casing 104 is surrounded by a thermally defined environment of a second thermal buffer zone 121 within a thermal buffer casing 125.

Each thermal buffer casing will comprise a bottom opening and an associated shielding element (e.g. floating shield and/or bellows). The configuration of the one or more thermal buffer casings and enclosed test zone casing may be of any number of arrangements, for example, the casings may be concentrically nested cylinders, as depicted in FIG. 1 and FIG. 2.

The thermal buffer zone created by the one or more thermal buffer casings may be maintained at a temperature lower than that of the surrounding volume of the housing and higher than that of the test zone. For example, in an exemplary embodiment of the invention, the components of the test zone are maintained at a temperature of about 4K while surrounded by a second thermally isolated zone kept at about 40-60K, for example, at about 50K.

In a primary implementation, two thermal casings, e.g., the test zone 104 and thermal buffer casing 125 depicted in FIG. 1 and FIG. 2, are utilized, resulting in two thermally defined zones, a test zone and a thermal buffering zone. It will be understood that additional thermal casings may be utilized, each with its own bottom opening and its own bottom opening shielding element (e.g. floating shield and/ or compliant bellows), for example, to define a third, fourth, or higher order thermally isolated buffer zones, and that the series of casings may be configured concentrically within each other. Such arrangements allows the innermost casing, or the test zone casing, to be set to extremely low temperatures and be isolated within multiple layers of thermal shielding and buffering.

Configuration within the housing. One or more structural members may support the test zone casing, thermal buffer zone casing(s), magnetic shield casing (if present), and other portions of the system. In certain embodiments, structural members 129, 130 provide support, for example, connecting outer wall of the test zone casing 104 to the inner wall of the thermal buffer casing 125, and connecting the outer wall of the thermal buffer casing 125 to the outer housing 124. Generally, the structural members should have a low thermal conductivity and be configured, in size, number, and location to provide sufficient support to hold the nested casings in place. In certain embodiments, one or more structural members comprises a flexing material or comprises a flexing shape or design to accommodate differing thermal coefficients of expansion and differential expansion due to different temperatures of the elements.

Cooling Elements. The probe station of the invention will comprise a plurality of cooling elements. Each cooling element comprises a device or system which removes heat from the structure in or on which the cooling element is present. For example, in a primary embodiment, one or more cooling elements is present in or on each casing. The cooling elements will be sized and configured to maintain each zone at selected temperature conditions. Cooling elements may be located on/within the central column, or may be internal to or attached to a casing.

In one implementation, the one or more cooling elements comprises a heat exchanger, for example, a heat exchanger comprising coils or other structures through which a liquid cryogen is flowed, such as liquid helium, liquid nitrogen, or other liquefied gases known in the art. In certain embodiments, the liquid cryogen is pumped or otherwise supplied from an external source by hoses or conduits connecting through the outer casing (as described below) and contained within the column. In an exemplary embodiment of the invention, referring to FIG. 4, a plurality of cooling elements 123 are present in the apparatus 100, or probe station. Within the apparatus 100, the liquid cryogen flows through tubes to the cooling elements. The tubes may be found within certain features of the apparatus, such as within the column 101, or through the casings, housings, and shielding materials. In certain embodiments, an inlet port 203 provides an opening for introducing a liquid cryogen into the system, while the outlet port 204 provides an opening for the removal of the liquid cryogen from the system. The flow of the liquid cryogen into the system cools the plurality of cooling elements 123 located throughout the apparatus 100. Still referring to FIG. 4, the heat exchanger 123 may be located in the test zone 113, and between the test zone casing 104 and thermal buffer casing 125. One or more additional cooling elements may be utilized, for example, in the thermally defined environment of a second thermal buffer zone 121. In certain embodiments of the invention, the cooling system further includes service lines 201. Furthermore, in certain embodiments of the invention, the column 101 includes a thermal insulator 202 material.

Dry Probe Systems. In an alternative embodiment, the one or more cooling elements may be physical structures comprising heat sinks, for example, being conductive materials such as copper, which are in thermally conductive connection with a cooling apparatus and by which such conductive elements, heat is withdrawn from the thermally defined zones. Prior art probe stations struggle with maintaining temperatures around 4 K, requiring either copious amounts of incurably precious liquid Helium, or an abundance of large commercially available 2-stage pulse tubes or Gifford-McMahon cryocoolers. One solution to the problem of liquid helium use is the use of closed cycle cryo-coolers, in what will be termed "dry" wafer testing systems.

Provided herein are improved dry systems. A first point of novelty in the improved dry systems of the invention is the dividing of cooling functions between two separate cryo-cooler elements. Cooling of the elements in the dry systems of the invention is accomplished by splitting the cooling for the test zone and thermal buffer zone(s) separate cryo-coolers. In a first implementation, the improved systems of the invention comprise the use of two separate cooling elements, e.g. liquid helium cryo-coolers or equivalent units wherein the cryogenic stages of the cryo-coolers are located on or in the static portion of the wafer probing station (with suitable connections to cryo-cooler components outside the device, such as pumps, compressors, and reservoirs of coolant. The first cooling element will cool the static components of the thermal buffer zone to an intermediate temperature, for example, a temperature between 10-30K, for example, ~15-20K. The cryogenic stage of the second cooling element may be located within the intermediate buffering zone (with suitable connections to components outside of the outer housing, for example, pumps, compressors, and reservoirs of coolant) and achieves low temperature (e.g. 1-6 K) cooling of the moving test components enclosed within the test zone casing by a thermally conductive connection comprising a series of elements, including flexible straps. The novel configuration of the invention enables the use of large cooler units, both operating on the static stages, which decreases the complexity of cooling the inner testing environment. In a primary implementation, the cryo-coolers are closed cycle cryo-coolers, for example, liquid helium cryo-coolers, or may comprise cooler such as Gifford-McMahon cooling systems, abidatic demagnetization systems, Stirling engines, and pulse tube refrigerators. In a given system, the low temperature stage may be cooled by a first cooling element optimized for low temperature testing conditions, for example, cooling to 1-6 K, for example, a system such as the Cryomech PT420™ (Cryomech Systems, Syracuse NY). Meanwhile, the shield stage may be cooled by a second dedicated cooler optimized for cooling to 10-35K, for example, ~15-25 K, for example, a system such as the Cryomech AL 630™ (Cryomech Systems, Syracuse NY).

A second point of novelty in the dry systems of the invention is an improved flexible strap design. The design of effective flexible and thermally conductive straps is quite challenging as it places opposing requirements on the straps. To be conductive they should be thick, short and made of high conductivity materials such as pure copper or pure aluminum. To be flexible, they should be long, thin, and made of stronger materials. This design paradox is quite challenging, and straps are prone to subtle failure modes such as work-hardening of the straps leading to decreases in thermal conductivity.

The scope of the invention encompasses novel flexible and thermally conductive straps comprising a material selected wherein thermal conduction increases in the temperature range of about 15-25 K. For example, materials with very high thermal conductivity such as pure alloys of copper and aluminum drastically increase in thermal conductivity in this temperature range, greatly lessening the amount of strap material required. Additionally, the allowable difference in temperature between the mobile shield stage and static shield stage is increased allowing for the use of less strap material, increasing flexibility. Lastly, if implemented properly, cutting the temperature of the static shield stage reduces the heat loads on the mobile stages, again reducing the amount strap material required. With the strap material requirements cut to very low levels, the desired balance of conductivity and flexibility in the straps is met far more easily.

Figure 22:
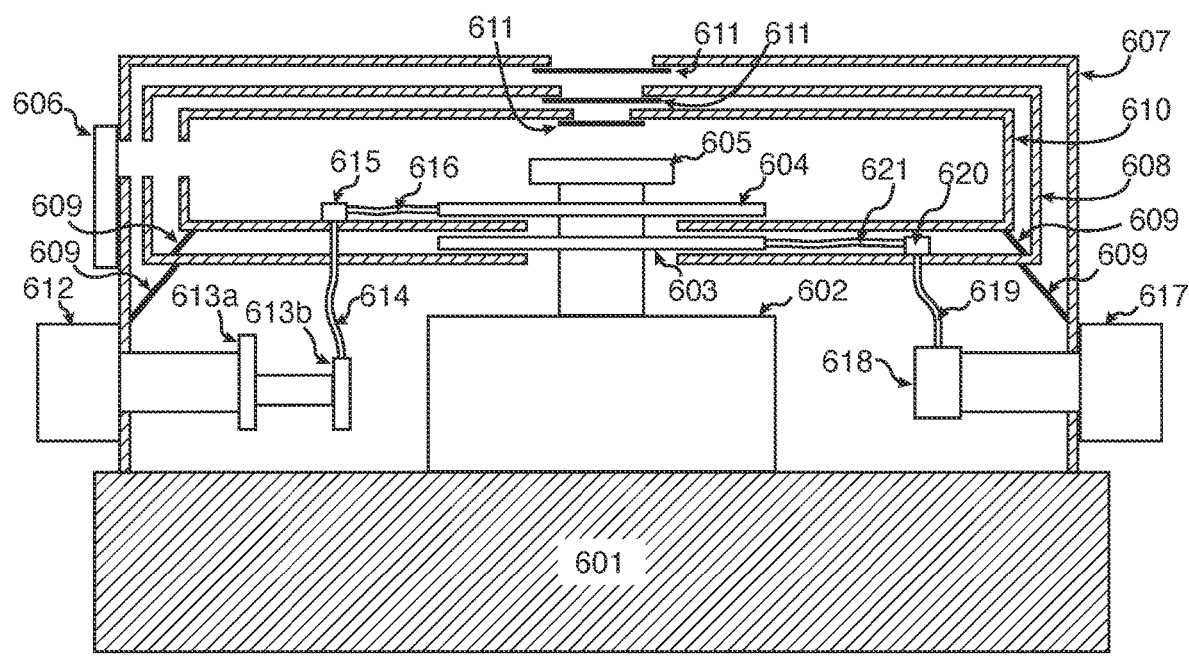
FIG. 22 depicts an exemplary dry testing system configuration comprising straps that connect static and moving stages to cooling elements.

FIG. 22 depicts an exemplary dry cryogenic probe station of the invention. In this implementation, wafers are inserted into the probe station by standard wafer handling equipment known in the art. The wafers enter the system through doors 606. The wafers are held by mechanical clamps of onto the chuck 605. This interface causes the wafer to reach cryogenic temperatures. The motion stage 602 moves the chuck and mobile elements such that different regions of the wafer may be imaged through the windows 611 and interrogated by electronic, optical or other means depending on the nature of the probe station. A common example would be electrical probing wherein a set of probes disposed within the static shield element 610 would make electronic contact with different parts of the wafer. The low temperature mobile and static elements are cooled by a commercial two-stage cryocooler 612. The first stage of this cooler 613*a* need not be connected to anything thermally, but may be used to provide auxiliary cooling to other (not shown) parts of the system. The second stage of the cryocooler 613*b* is connected to the low-temperature static stage 615 via one or more first thermal links 614. The low-temperature mobile stage 604 and chuck are thermally anchored to the low-temperature static stage via one or more first compliant thermally conductive straps 616.

The intermediate static and mobile elements (608 and 603 respectively) are cooled in a similar fashion. The intermediate cryocooler 617 is optimized for cooling in the 10-30 K temperature regime. The cryogenic interface of the cryocooler 618 is attached to the thermalization block 620 via one or more second thermal links 619. The mobile intermediate stage element 603 is cooled via one or more second flexible thermally conductive straps 621.

One element of the system is what will be referred to herein as a "thermalization block." These elements serve as thermal bulkhead connection or junction between the flexible thermal straps and their respective cryocoolers. The thermalization block may be composed of any metal, for example, high purity copper or high purity aluminum, and may be manufactured by any means, for example, by machining. Exemplary shapes are cubes or rectangular prisms. Exemplary dimensions are, for example, in the range of 2-10 cm length and width and 1-5 cm in height, for example, 5 cm width, 5 cm length, and 1.5 cm height. Each thermal block can be connected to the inner a floating shield, for example, thermal blocks 615 and 620 as depicted in FIG. 22.

Another element of the dry probe system is the "Thermal Link." These structures conduct heat away from cooled elements. In some implementations, the thermal links are substantially solid or minimally flexible. In a preferred implementation, the thermal link structures are slightly flexible in order to allow for a little thermal contraction or vibration isolation, for example, having a range of motion of 2-10 mm. The thermal links can be configured as straps or band, for example, comprising multiple layers of metal foils, for example, a structure comprising stacked foils, for example, comprising 2-10 layers of foils of 2-5 mm in thickness. In other implementations, the thermal links may comprise cables, rods, structures comprising one or more joints, or other configurations that enable a small range of movement. Thermal link materials may comprise any thermally conductive material, for example, high purity copper, high purity aluminum, or carbon compositions. The thermal links are joined at one end to a cryocooler, for example, the second stage of a cryocooler. The thermal links are joined at the other end to a thermalization block. Thermal links can be connected to structures at their ends by screws, bolts, welding, brazing, or soldering.

Flexible thermal straps. These elements must be conductive but also flexible, for example, having a range of motion of 20-200 mm, for example, 50-100 mm. In a primary implementation, the straps comprise materials having high thermal conductivity. The straps may be planar or may comprise cables. In one implementation, the straps are substantially planar, composed of multiple layers, for example, a laminate of two or more layers of foil, for example, 5-30 layers, for example, 10-20 layers, for example, 8 layers. For example, the strap may comprise a stack of foils having a thickness of 0.25-2 mm, a width of 25-75 mm, and a length approximately 3 times the maximum horizontal range of motion, for example. The foil layers may be connected together across the entire length of the strap, intermittently across the length of the strap, or, in a primary implementation, only at the ends of the strap to form plates for joining to other structures. The foil layers may be joined together, for example, by welding (e.g. TIG or diffusion welding), brazing, soldering, or by mechanical connections such as screws. One end of each strap will connect to a thermalization block, and the other end will connect to a structure selected from the floating shield, casing, motion stage, or chuck. For example, as depicted in FIG. 22, strap 622 connects to the lower floating shield (e.g. 50 K shield) and strap 616 connects to the upper, inner floating shield (e.g. 4 K floating shield). The straps may be connected to elements at their ends by welding (e.g. TIG or diffusion welding), brazing, soldering, or by mechanical connection such as screws or bolts.

In a primary implementation, the materials have high, or maximum, thermal conductivity in the range of 15 to 35 K. Exemplary materials include copper, aluminum, alloys comprising copper or aluminum, and other metals. For example, the straps may comprise copper or aluminum, for example, substantially pure copper or aluminum (e.g. 4N, 5N, or 6N purity). Exemplary materials include, for example, 101 copper, 1000 series aluminum, 5N pure aluminum or copper, or conductive crystals in filament or laminate form, such a silicon, sapphire, silicon carbide, and aluminum nitride.

Figure 23A:
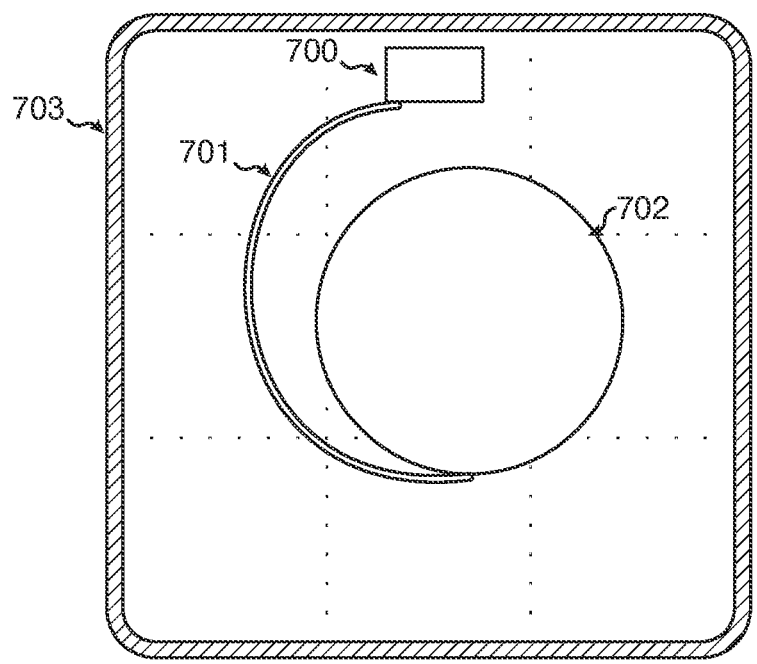
FIG. 23A is a top view in a dry system of the invention depicting a thermal stage and strap connecting it to a thermalization block in a first position.
Figure 23B:
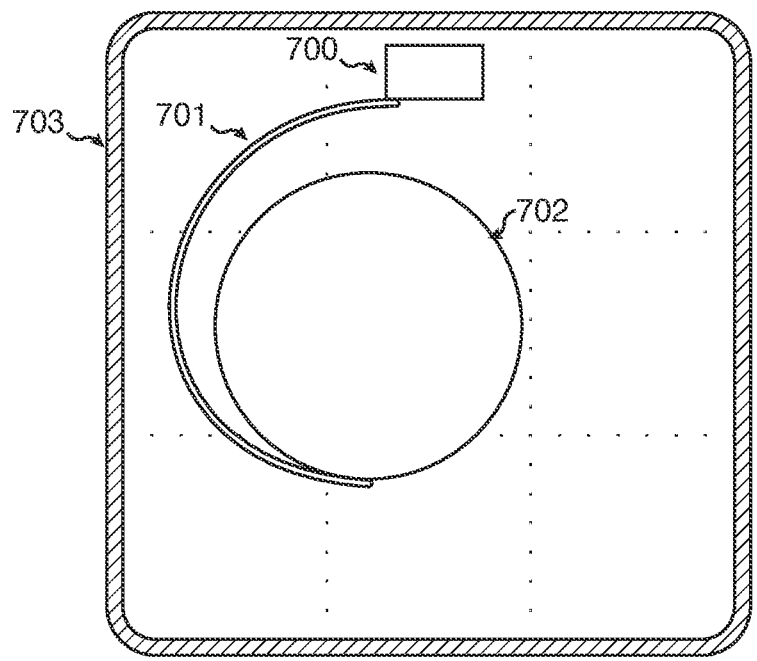
FIG. 23B depicts the thermal stage and strap in an extended position.

FIG. 23A and FIG. 23B are diagrammatic presentations of the range of motion achieved by the thermally conductive strap. The thermalization block 700 has flexible strap 701 affixed to it. The appropriate mobile stage element 702 is affixed to the other end of the thermal strap. In FIG. 23A, the stage element 702 is depicted in a first position. In FIG. 23B, the stage element 702 is depicted in a second position, the range of motion enabled by the flexible strap.

Figure 24A:
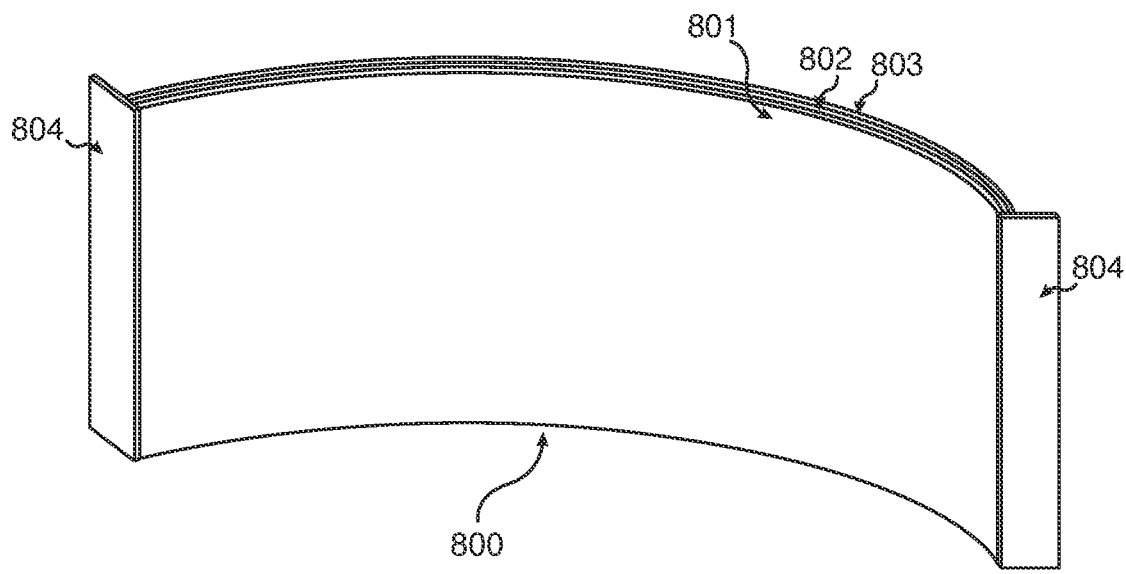
FIG. 24 depicts a perspective view of flexible thermal strap comprised of layers of foil.
Figure 24B:
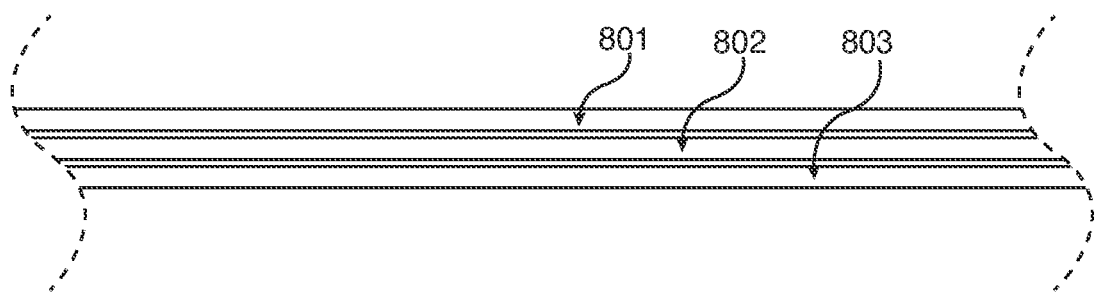

FIG. 24A depicts a flexible thermal strap. The strap 800 is composed of three foils 801, 802, and 803 and end plates 804 and 805 comprising short sections where the foil layers are joined together for example, by welding, brazing, or soldering. The end plates are joined to a thermalization block at one end and an element of a mobile stage at the opposite end.

Wafer Access Doors. The wafers or other electronic components to be tested are introduced from the exterior of the outer housing to the chuck, traversing any intervening casings, via a series of aligned gated slots. The gated slots may comprise doors that are lifted by an actuator, under the control of a computerized control system.

Certain embodiments of the invention include a door assembly 150 that is located over the gated slots to provide a contiguous thermal casing while not in the process of transferring wafers into or out of the system. As seen in FIG. 1, the access through the gated slots 116*a*, 116*b*, 116*c*, and 116*d* is achieved by the opening and closing of the door assembly 150, which is connected to an actuator 154 through a support rod 153. It can be appreciated that an actuator 154 includes, for example, a motor that moves the support rod 153 in a vertical direction. The actuator will be in connection with control lines and power lines outside the outer housing, for example, by holes in or conduits though the outer casing.

Figure 3A:
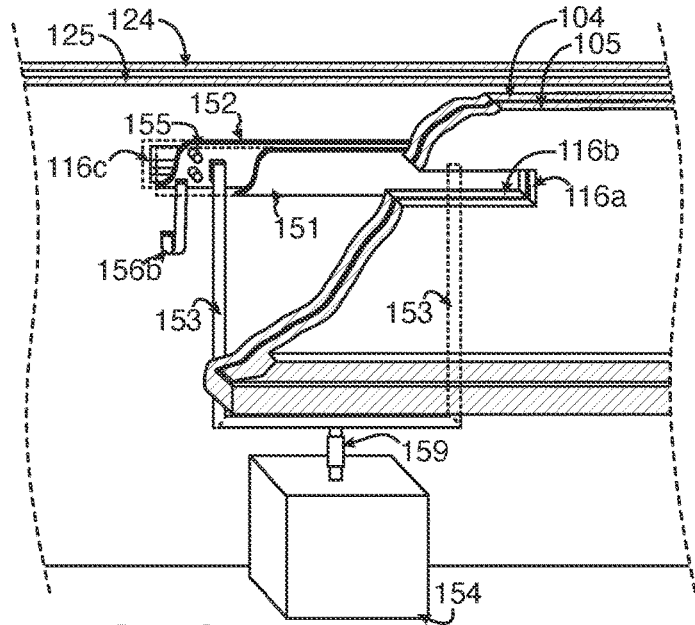
FIG. 3A depicts a perspective sectional view of an embodiment of the door assembly from the interior of the probe station system.
Figure 3B:
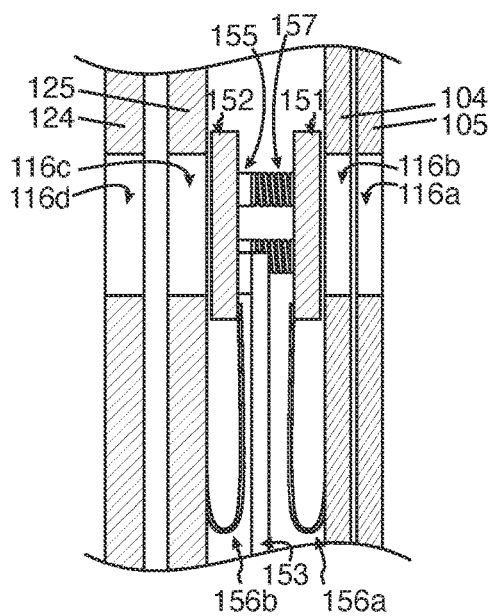
FIG. 3B depicts a side sectional view of an embodiment of the door assembly of the probe station system.
Figure 3C:
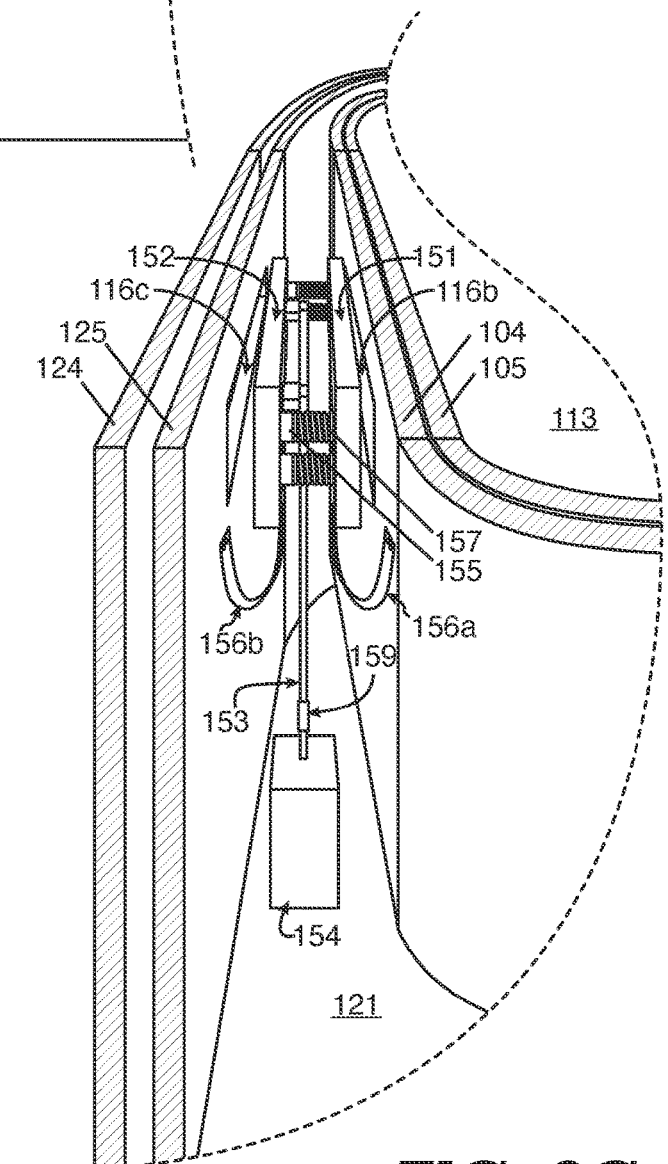
FIG. 3C depicts a side perspective view of an embodiment of the door assembly of the probe station system.
Figure 4:
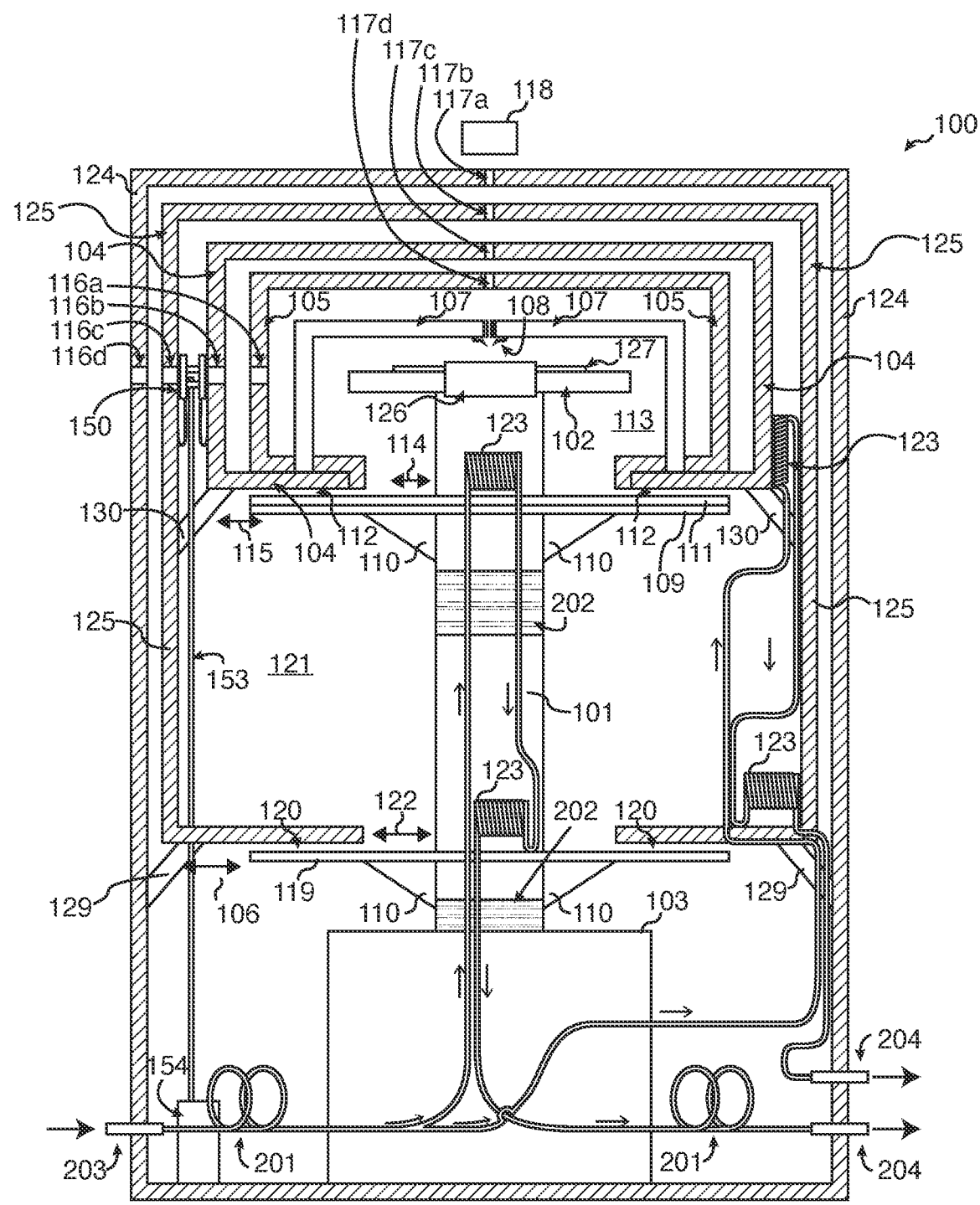
FIG. 4 depicts a side cross-sectional view of an exemplary arrangement of cooling elements and associated tubing for the flow of liquid cryogens.

Referring to FIGS. 3A, 3B, and 3C, in certain embodiments of the invention, the door assembly 150 is located between the test zone casing 104 and the thermal buffer casing 125. Referring to FIG. 3C, in certain embodiments of the invention, a door assembly 150 includes a first door 151 that is disposed towards the test zone 113, and located adjacent to the test zone casing 104. Further referring to FIG. 3C, the door assembly 150 includes a second door 152 located adjacent to the thermal buffer casing 125. Generally, the first door 151 and second door 152 have an area that is larger than the gated slots 116a, 116b, 116c, and 116d that are located on the casings. A close-up side, cross-sectional view of the door assembly, located relative to the test zone casing 104, magnetic shield casing 105, thermal buffer casing 125, outer housing 124, and the gated slots 116a, 116b, 116c, and 116d are shown in FIG. 3B.

It is appreciated that a first door 151, in certain embodiments, insulates the cryogenic conditions of the test zone 113, for example, wherein such cryogenic condition is set to 4K. The first door 151 may be referred to as the "test zone door" in certain embodiments. It is also appreciated that the second door 152, insulates the thermally defined environment of the second thermal buffer zone 121, as seen in FIG. 1 and FIG. 3C. The second door 152 may be referred to as the "thermal buffer door" in certain embodiments. The first door 151 and second door 152 are oriented in a coplanar orientation, and attached together with one or more insulating elements 155, as seen in FIGS. 3A, 3B, and 3C. The insulating elements 155 prevent the transfer of thermal radiation and heat from one door to another. Still referring to FIGS. 3B and 3C, springs 157 provide an extension force of the first door 151 and second door 152. Furthermore, each door will comprise one or more thermally conducting strips of material (e.g. metal such as copper, aluminum, or alloys thereof), termed "thermal strips" herein, connecting the door of a door assembly 150 with the casing to cool the doors and to help maintain cryogenic conditions in each of the thermally isolated zones. As seen in FIGS. 3A, 3B, and 3C, a thermal strip 156a connects the test zone door 151 and the test zone casing 104, while another thermal strip 156b connects the thermal buffer door 152 and the thermal buffer casing 125. The thermal strips will be of sufficient thermal conductivity to effectively withdraw heat from the doors and of sufficient flexibility to move with the doors as they are actuated into open and closed positions.

The test zone door 151 and thermal buffer door 152 are attached to an actuator 154 with one or more support rods 153. In certain embodiments of the invention, a plurality of support rods 153 are attached to the doors 151, 152, which is further attached to the actuator 154, as seen in FIG. 3A. Referring to FIGS. 3A and 3C, an insulating element 159 may be found in the connection between the actuator 154 and the doors 151, 152 to prevent the transfer of thermal radiation or heat.

Wafer Testing Systems. In one aspect, the scope of the invention encompasses a system for testing wafers, by use of the probe station of the invention, under thermally defined and, optionally, magnetically isolated conditions. In the wafer testing systems of the invention, a wafer-feeding system is located external to the probe station device of the invention. The wafer feeding system comprises an apparatus that introduces and withdraws the wafers, or other electronic components to be tested, to the chuck within the work zone for testing. Upon completion of the testing, the wafer-feeding system transports the wafer or other electronic component out of the device. In certain embodiments, the wafer feeding systems includes a cassette or magazine in which a plurality of wafers are held. The wafer feeding system comprises a retractable arm, for example, a telescoping arm, the end of which may comprise elements for moving a wafer into and out of the probe station. The telescoping arm may comprise pincers, clips, or other actuating structures that grasps and releases a wafer, generally in the exclusion zone of the wafer. The arm may be motorized or actuated manually. In a primary implementation, the end of the wafer feeding arm comprises a paddle or other flat structure, onto which the wafer is scooped or lifted, followed by movement of the paddle or other flat structure into and out of the probe station. By the arm, the wafer is introduced to the chuck for testing and is withdrawn therefrom after testing. The wafer feeding system holds the wafer(s) in vacuum and is separated from the outer housing of the chamber 124 by a commercial slot valve to open and close the boundary between the two vacuum spaces shown in FIG. 1 as 116d.

In certain embodiments of the invention, the system includes a wafer-handling robot. An exemplary wafer-feeding system is provided by Brooks Automation®.

In the wafer testing systems of the invention, external to probe station device will be one or more computer control systems for operation of the apparatus. The one or more computer control systems comprise processor elements and software for: coordinating the introduction and withdrawal of the wafer to the chuck; actuation of clamping elements on the chuck to secure and release the wafer; movement of the column to facilitate sealing of the test zone and any thermal buffer zones by floating shields; positioning of the wafer and contacting of the wafer with the probe card; operation of the probe card and data collection therefrom; and operation of the aligned doors of the gated slots, and control of the cryogenic environment. Motors, actuators, signal and control wires, and other elements necessary for achievement of the enumerated processes are understood to be present in the systems of the invention.

Vacuum Chamber Surface for Instruments. The scope of the invention further encompasses novel vacuum chamber designs for use with precision instruments, such as the probe station of the present invention. In many contexts, measurements or other operations must be performed in a vacuum environment. Additionally, in many cases, such vacuum operations require movement of components with extremely high precision. For example, in the case of cryogenic wafer testing, positioning of the wafer under the probe card requires accurate movement of the wafer to tolerances in the range of ~1-15 microns.

Manipulation of components with high precision can be achieved by many types of instruments. However, in order to maintain tolerances in the micron range, it is essential that the surface upon which the instruments are placed have extreme flatness. Flatness can be expressed as the deviation of a surface from a perfectly flat surface.

Metals can be readily machined and polished to very high flatness, and can serve as a base surface for precision instruments. Typical vacuum chamber bases are made of thick metal such as steel or aluminum alloys. However, metal has an inherent flexibility which is problematic in the context of vacuum chambers, wherein the outer surfaces defining the vacuum chamber are subjected to enormous pressure as vacuum conditions are established within. For example, a square meter of area with vacuum on one side and standard atmosphere on the other experiences atmospheric force of ~23,000 lbf. These immense forces act on the metal base and can result in flexure of the base and loss of flatness. Furthermore, metals are highly conductive of heat and have significant coefficients of thermal expansion, wherein the temperature differential between the outer surface of a cryogenic vacuum chamber and the inner surface will result in flexure of the metal and a substantial disruption of flatness. On the other hand, metal is an ideal surface for achieving high levels of vacuum.

Accordingly, there is a need in the art for novel vacuum chamber designs that provide a bottom surface with extreme flatness, for the placement of precision instruments, and which maintain their flatness when operated under vacuum. The scope of the invention encompasses a novel vacuum chamber base comprising a high stiffness slab, comprising a substantially planar body, upon which a metal plate comprising a top surface of high flatness is mounted. In the novel assemblies of the invention, the slab has very high flatness, very high stiffness, and high thermal inertia. The slab is thus highly resistant to the atmospheric and thermal forces that act to deform metal vacuum chamber bases. In various embodiments, the flatness of the working surface may be in the range of less than 1 micron, less than 2 microns, less than 3 microns, less than 4 microns, less than 5 microns, less than 6 microns, less than 7 microns, less than 8 microns, less than 9 microns, or less than 10 microns.

The slab will comprise a material of high stiffness. Stiffness, in material science, may be measured as the resistance of a material to deformation. Stiffness may be assessed by the elastic modulus (a.k.a. Young's modulus), E, wherein the greater the value of E, the larger the stress that is needed to achieve deformation of the material. In one embodiment, the slab will comprise a material having high stiffness, for example, in various embodiments, being a stiffness with elastic modulus above 50 GPa, above 60 GPa, above 70 GPa, above 80 GPa, above 90 GPa, or above 100 GPa.

The high stiffness material may comprise any high stiffness material, for example, organic materials, inorganic materials, synthetic materials, polymeric materials, composites of various materials, and natural materials such as rock. In one embodiment, the base is made of rock. In one embodiment, the slab is made of a high stiffness rock such as granite, diabase, gneiss, whinstone, diorite, and others known in the art. High stiffness rocks include those with minimal porosity and jointing, which properties may vary among rocks of the same type depending on location, composition, and the formation process of the rock. The anisotropy of the mineral structure will also influence stiffness, with higher anisotropy imparting greater stiffness. Preferably, the material of the slab comprises a homogenous, isotropic granite. In one embodiment, the rock is granite.

A working surface, comprising a metal plate of high flatness, is mounted to the slab and forms the bottom, inner surface of the vacuum chamber. The plate is mounted to the slab by a plurality of fastening elements, with the fastening elements spaced at a sufficient density to maintain the flatness of the metal. By combining the metal plate with the slab, the unique properties of each material can be harnessed. The metal plate is not permeable to air and works to seal the vessel. The metal plate can also be polished to very high flatness. When joined to the slab, e.g. a granite slab, by a sufficient number of fasteners, the high stiffness of the slab is imparted to the metal plate, enabling it to maintain high flatness under the challenging vacuum and thermal forces.

The metal plate may comprise any number of high strength metals, including steel, aluminum, and aluminum alloys such as ATPS, 6061, or others known in the art. The plate may have a thickness, for example, of 5-50 mm, for example about 10-50 mm, for example, 15-25 mm. The plate may be a rectangular slab or prism, may be disk shaped, or may have an irregular shape, with the lateral dimensions of the plate (e.g., width and length or diameter) selected to conform to the size of the vacuum chamber.

Figure 14:
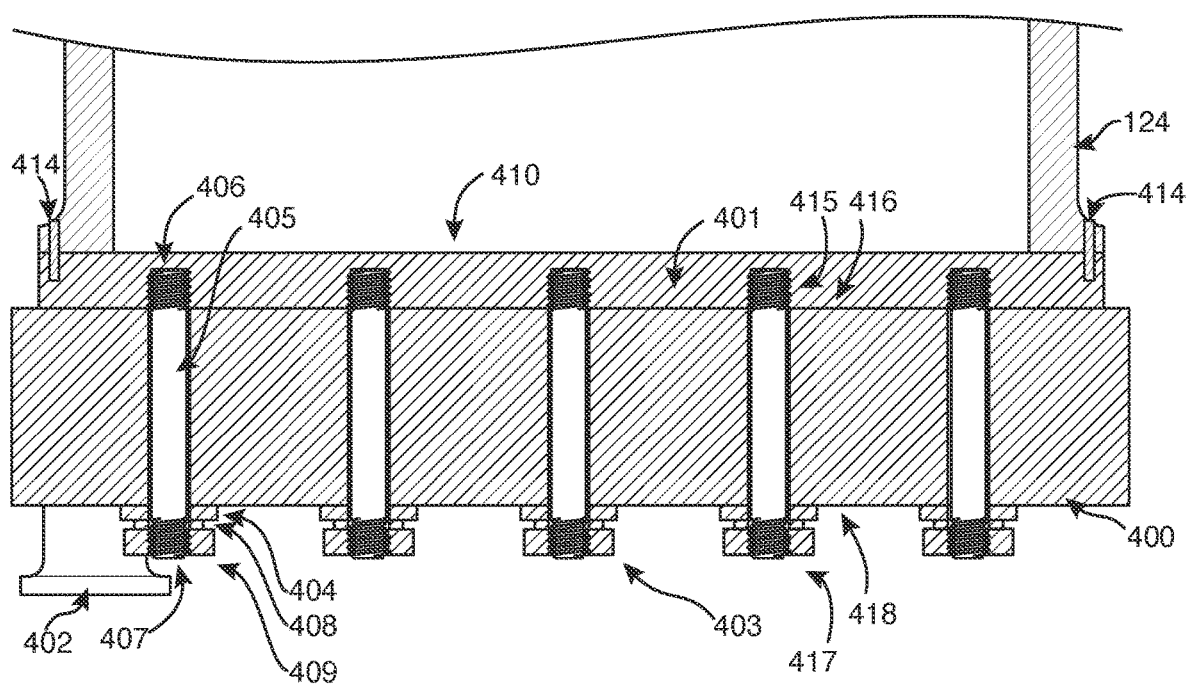
FIG. 14 is a side cross-sectional view of an exemplary testing apparatus, comprising a base.

The plate may comprise a number of holes, for example, threaded holes, for example, made by machining, on the bottom surface that enable the plate to be screwed, bolted, or otherwise fastened to the slab. In a primary embodiment, the holes are blind holes that do not pass through the entire thickness of the plate, for example, as depicted in FIG. 14.

Figure 13:
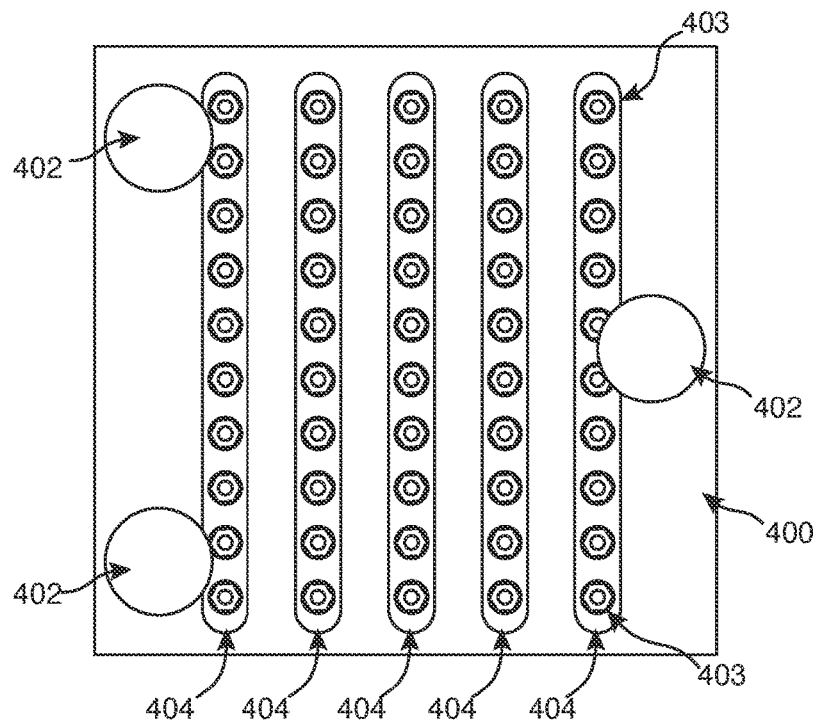
FIG. 13 is a bottom view of an exemplary testing apparatus, comprising a base.

The holes will be of sufficient numbers to hold the plate firmly to the slab. The holes may be arranged in a grid or other pattern, for example, in a 3-by-3 cm grid, 5-by-5 cm grid, a 7.5-by-7.5 cm, a 10-by-10 cm grid, etc., for example, as depicted in FIG. 13.

The vacuum vessel plate may be fastened to the slab by any number of fasteners, including bolts, screws, studs, or tie-rods. The use of studs, tie-rods, or like structures is advantageous in that such fasteners can hold the vacuum vessel plate to the slab by tensile forces.

In an alternative implementation, the vacuum vessel plate is omitted and the vacuum vessel jacket or body is fastened directly to the slab, for example, by bolts, tie rods or other fasteners. In this implementation, the upper surface of the slab becomes the working surface of the base, and the upper surface must be polished, ground, or otherwise processed to impart the desired level of flatness, for example, a flatness of less than 10 microns, for example, a flatness of 5-7 microns. In this implementation, the use of porous materials such as rock for the slab can compromise the airtight seal of the vacuum chamber. This effect can be mitigated or substantially ablated by the use of a sealant, wherein the top surface of the slab is treated with a polymeric resin or like material that can infiltrate the interstices of the top layer of the rock and then be hardened or cross linked to create a substantially airtight top surface. Exemplary resin materials include glycidyl based resins, bisphenol A resins, BADGE or DGEBA based resins, linear polyethers with glycidyl end groups, Novolac epoxy resins, aliphatic epoxy resins, Halogenated epoxy resins, Epoxy resins diluents, glycidylamine epoxy resins. The resins may be cured by reaction with curatives to form three-dimensional cross-linked thermoset structures. Curing can be self-reactive or by the use of hardeners or curing compositions, such as anionic catalysts, polyfunctional primary amines, aliphatic amines, cycloaliphatic amines, and aromatic amines, cyclic anhydrides, polyphenols, mercaptans, and other agents known in the art. Exemplary commercial products include STYCAST™ resins, such as STYCAST 1266™.

Figure 11:
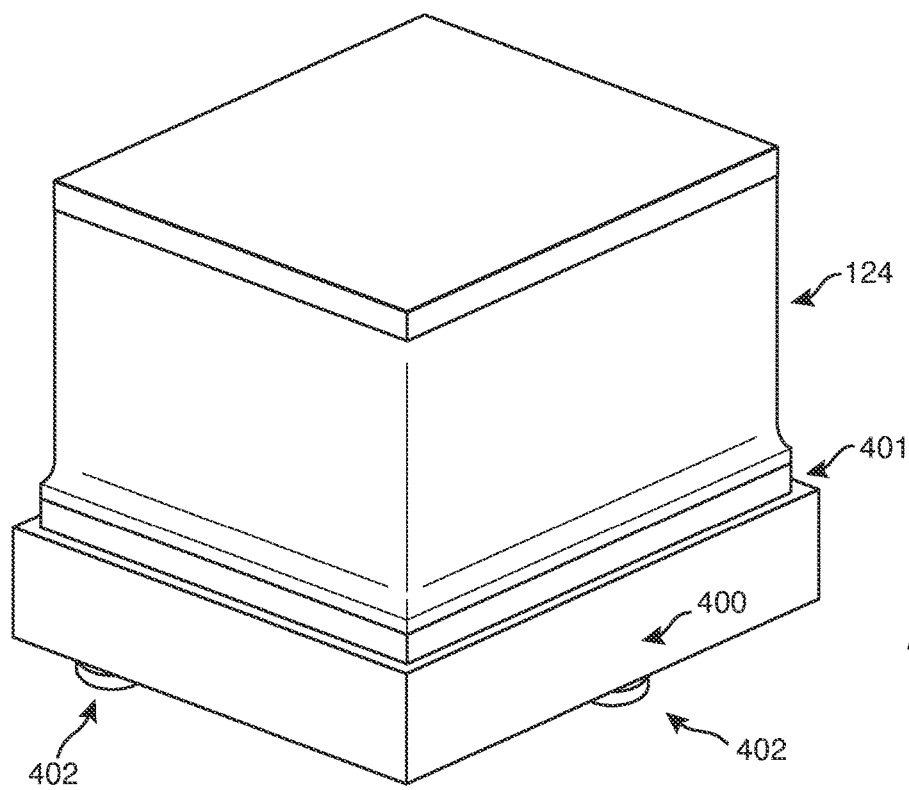
FIG. 11 depicts a perspective view of a n exemplary testing apparatus, comprising a base.
Figure 12:
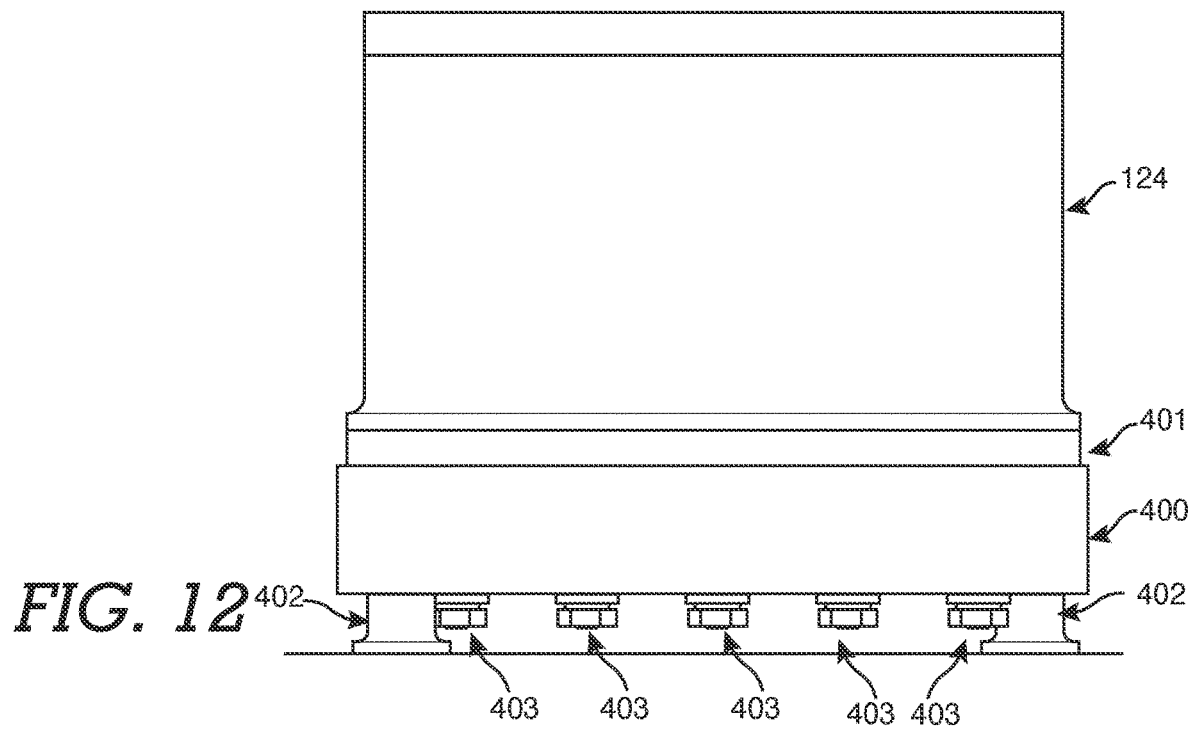
FIG. 12 is a side view of an exemplary testing apparatus, comprising a base.
Figure 18:
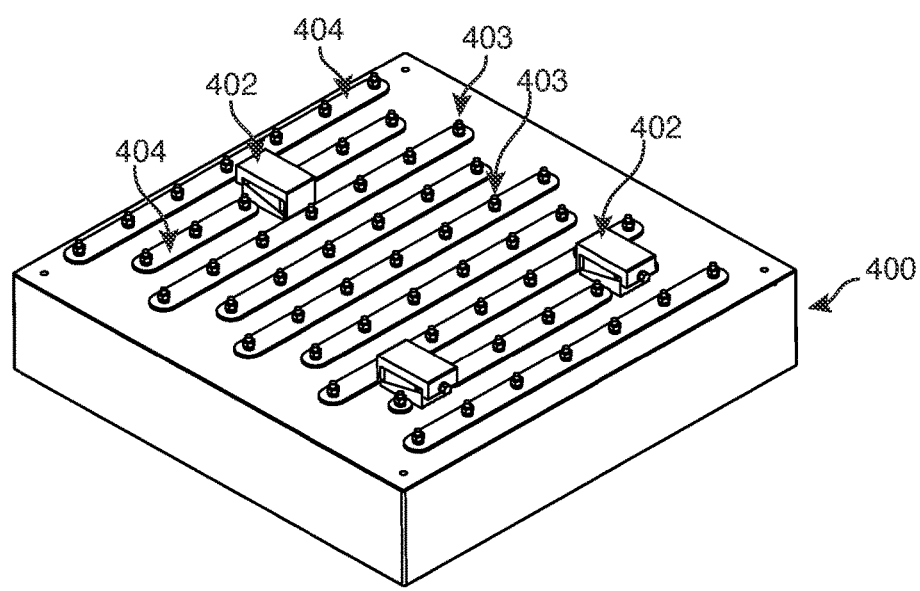
FIG. 18. depicts a lower perspective view of a vacuum vessel plate attached to a base in certain embodiments of the invention.

The following is a description of an exemplary embodiment of the vacuum chamber base of the invention. Referring to FIGS. 11 and 12, a vacuum chamber is attached to a vacuum vessel plate 401, which is further attached to a slab 400. The slab 400 is placed on one or more adjustable feet 402. Referring to FIGS. 13 and 18, showing a bottom view of the probe station device, a plurality of adjustable feet 402 are placed on the bottom of the slab 400. In preferred embodiments, three adjustable feet 402 are utilized. Adjustable feet allow for leveling of the device. It will be appreciated that the vacuum chamber may also be referred to as the outer housing 124. The outer housing 124 includes a vacuum vessel plate 401. The outer housing 124 is attached to the vacuum vessel plate 401 by for example, with bolts 414, although it will be appreciated that the attachment may be achieved by welding. It is also contemplated that the outer housing 124 and vacuum vessel plate 401 are a unitary piece. Referring to FIG. 12, a plurality of fasteners secure the base 400 with the vacuum vessel plate 401.

Figure 15:
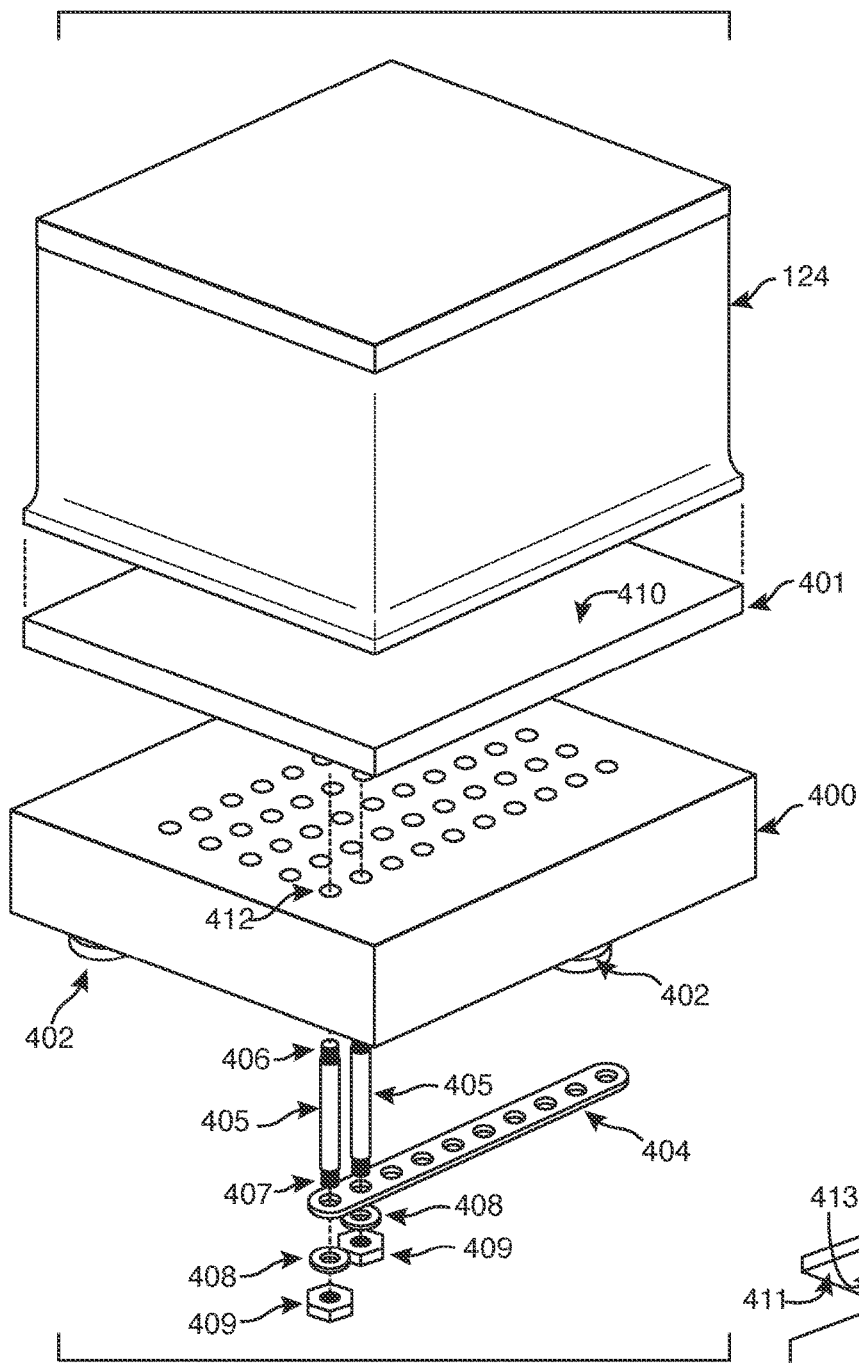
FIG. 15 depicts an exploded view of an exemplary testing apparatus, comprising a base.
Figure 16:
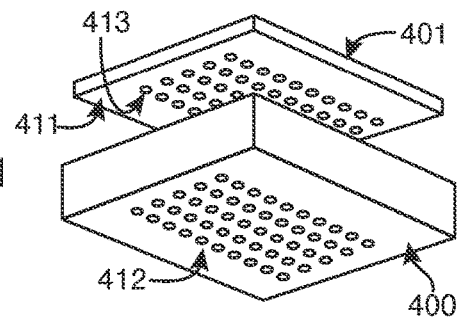
FIG. 16 depicts a lower perspective view of an exemplary base and exemplary vacuum vessel plate.

Referring to FIG. 14, showing a side cross-sectional view in certain embodiments of the invention, a plurality of fasteners 403 secure the vacuum vessel plate 401 to the slab 400. In certain embodiments of the invention, referring to FIG. 15, a first end 415 of the fastener is located on a first side 416 of the slab and attached to the vacuum vessel plate 401. A second end 417 of the fastener is located on a second side 418 of the slab and fastened, which attaches the vacuum vessel plate 401 with the slab 400. The attachment will be of sufficient tightness, by the use of bolts or other fasteners of appropriate size and spacing, to create and airtight junction that can maintain a vacuum within the chamber. Referring to FIGS. 14, 15, and 16, in certain embodiments, a fastener comprises a stud 405 having a first end 406 and second end 407. A stud first end 406 attaches to the fastening hole 413 located on the second surface 411 of the vacuum vessel plate 401. The stud passes through the through opening 412 from a first side to a second side of the slab, and a second end 407 is fastened with a nut 409 located on the lower surface of the slab. In certain embodiments, a washer 408 is placed adjacent to the nut 409. In certain embodiments of the invention, one or more fasteners are fastened to the vacuum vessel plate 401 through a load spreading plate 404. A load spreading plate comprises a flattened aspect that functions to spread the compressive force of the fasteners upon the slab. As seen, for example, in FIG. 18, showing a lower perspective view of the probe station device, the load spreading plate 404 spans across the surface of the slab 400 and is attached to one or more fasteners 403.

In certain embodiments of the invention, referring to FIGS. 15 and 16, the vacuum vessel plate 401 comprises a first surface 410, located on the upper portion, and comprises a second surface 411, located on the lower portion. Some or all areas of the first surface 410 have a flatness property that is within a certain flatness tolerance. Instruments or devices, which require such certain flatness tolerance are placed on top of such area. In certain embodiments of the invention, the vacuum vessel plate 401 second surface 411 further comprises a plurality of fastening holes 413. A fastening hole 413 is connected with the second surface 411 in certain embodiments. The fastening hole 413 is connected with the second surface 411 and the first surface 410 in certain other embodiments. The plurality of fastening holes 413 aligns with the plurality of through openings 412 of the slab 400. A plurality of fasteners 403 secures the vacuum vessel plate 401 to the slab 400. In certain embodiments of the invention, the distribution of the fastening holes 413 and the through openings 412 reduces possible perturbations of the first surface 410 of the vacuum vessel plate 401.

Figure 17:
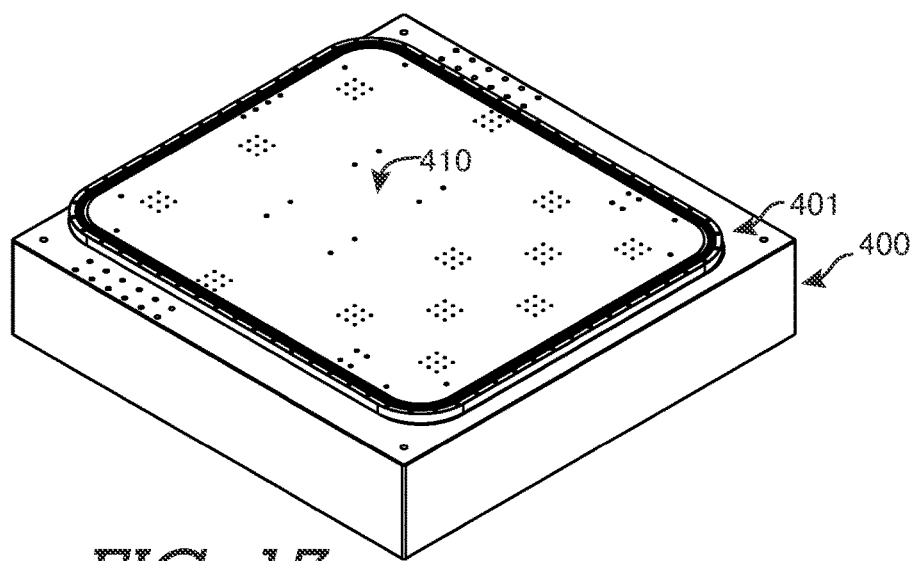
FIG. 17 depicts an upper perspective view of a vacuum vessel plate attached to a base in certain embodiments of the invention.

It will be appreciated that the combination of the vacuum vessel plate 401 and the slab 400 allows for the vacuum vessel plate to maintain its shape under a vacuum. There is an importance for the vacuum vessel plate 401, particularly the first surface 410 as seen in FIG. 17, to maintain its flatness under vacuum conditions.

In certain embodiments of the invention, the vacuum vessel plate 401 comprises a material that is impermeable to air such that a vacuum can be maintained. A vacuum vessel plate 401 comprises, for example, a metal. Preferred materials include aluminum, stainless steel, copper, and alloys thereof. While the material of the vacuum vessel plate 401 (e.g. aluminum) is impermeable to air and is appropriate for interfacing with a vacuum, it may also bend or change shape under vacuum conditions. The vacuum vessel plate 401, when attached to the slab 400 through the plurality of fasteners, reduces the bending, and helps to maintain flatness of the vacuum vessel plate that may occur under vacuum conditions.

Figure 21:
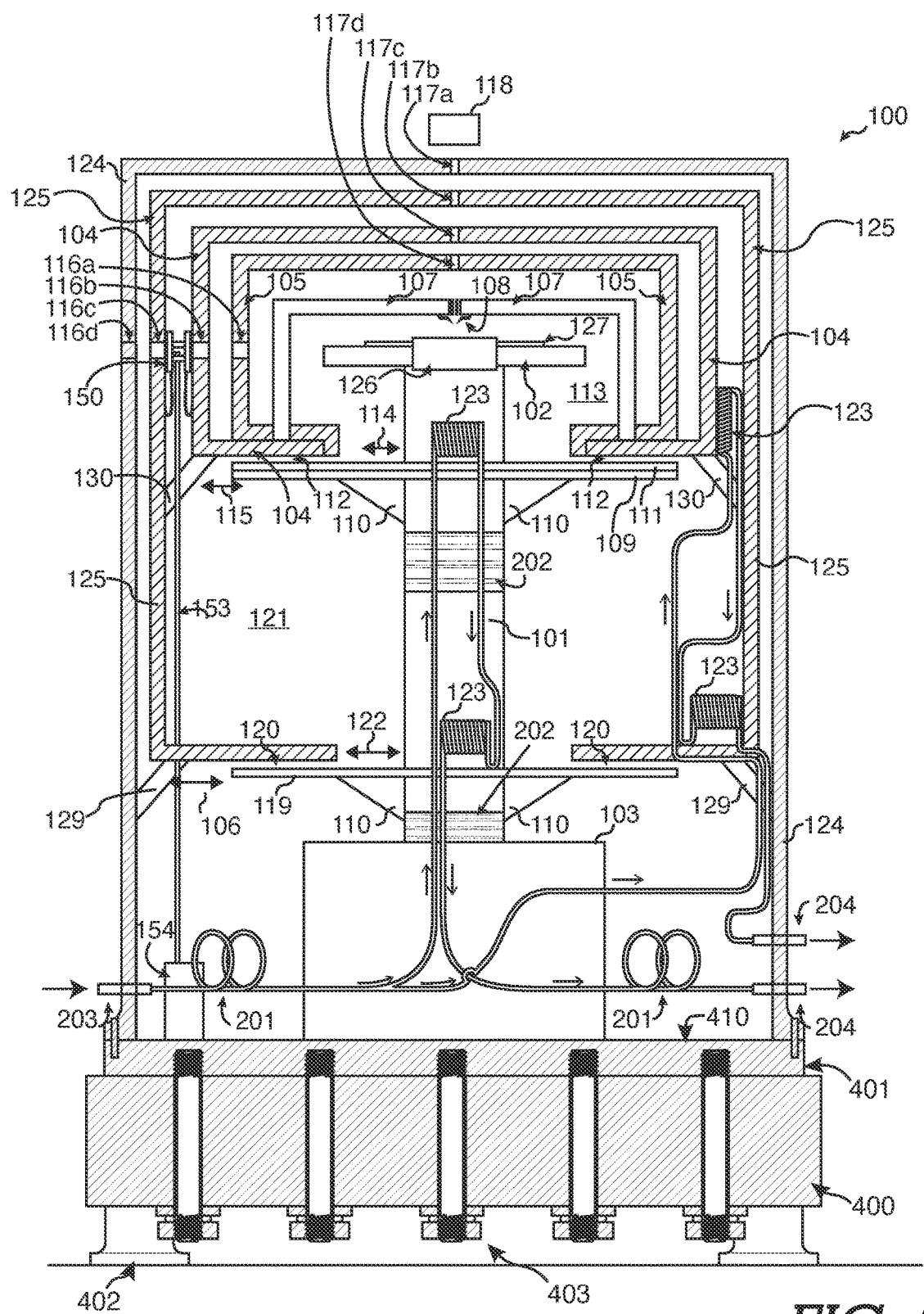
FIG. 21 depicts a side cross-sectional diagram of the testing apparatus in certain embodiments of the invention.

Vacuum Surface Preparation. In certain aspects of the invention, steps are taken to ensure the flatness of the vacuum vessel plate 401 first surface 410 (seen for example in FIG. 17). It is particularly important to ensure that the area on the first surface in which instruments are placed has a high degree of flatness. Such area of the first surface includes, for example, referring to FIG. 21, the first surface of the 410 vacuum vessel plate 401 holding the motion stage 103. It can be seen from FIG. 21 that the alignment of, for example, the probe card 108, which makes contact with the wafer 127, must be preserved while a vacuum and cryogenic conditions are introduced in the apparatus 100.

Figure 19:
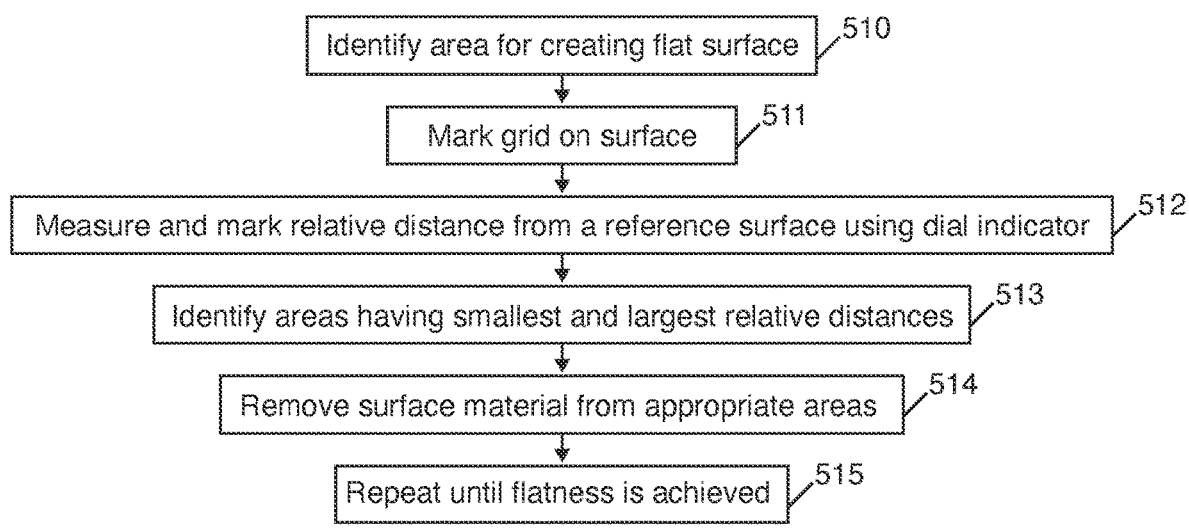
FIG. 19 is a flowchart of exemplary steps taken to flatten a surface of a vacuum vessel plate.

Referring to FIG. 19, the steps taken to create the flatness of a vacuum vessel plate 401 includes the following steps: (1) identifying the area for creating a flat surface 510; (2) marking a grid on the area 511; (3) measuring and marking relative distances from a reference surface 512; (4) identifying areas having smallest and largest relative distances 513; (5) removing surface materials from appropriate areas 514; and (6) repeating steps 1-5 until flatness is achieved 515. In certain embodiments, these steps are performed after the slab 400 is assembled with the vacuum vessel plate 401.

In the first step, (1) identifying the area for creating a flat surface 510, the area of the vacuum vessel plate 401 that requires flatness is identified and marked. Referring now to FIG. 20A, for example, the area 500 that requires flatness is located on the first surface of the 410 vacuum vessel plate 401. It can be appreciated that instruments, including for example, the motion stage, placed on this area.

In the second step, (2) marking a grid on the area 511 is performed. Referring to FIG. 20B, a grid 501 is marked on, within, or near the area 500 located on the first surface 410 of the vacuum vessel plate 401. An exemplary embodiment of a grid 501 is shown, for example, in FIG. 20C.

In the third step, (3) measuring and marking relative distances from a reference surface 512 is performed. Referring to FIG. 20B, a reference surface 502 can include a flat surface that has a known flatness and located on a reference block 505. The reference surface 502 of the reference block 505 is oriented parallel with the first surface 410 of the vacuum vessel plate 401. A reference block 505 may further be supported on support blocks 504. The reference block and support blocks may be moved along the slab 400, and a dial indicator 503 may be slid across the reference surface 502. The relative distance from the reference surface 502 to the vacuum vessel plate 401 is measured using the dial indicator, and marked on a grid 501.

In the fourth step, (4) identifying areas having smallest and largest relative distances 513 is performed. Referring to FIG. 20C, a plurality of relative distances 506 between the reference surface and the vacuum vessel plate 401, as measured with a dial indicator, for example, is marked along a grid 501. The largest relative distance and smallest relative distance may be marked along the grid. The relative distance measurements are used to identify the regions of surface that requires removal of material in order to achieve a flatness that is within the flatness tolerance of a motion stage.

In the fifth step, (5) removing surface materials from appropriate areas 514 is performed. The material of the vacuum vessel plate first surface is removed, for example, by sanding, grinding, or otherwise removing the material from the surface.

In the sixth step, (6) repeating steps 1-5 until flatness is achieved 515 is performed. Additional relative distance measurements are taken to confirm if enough material is removed. Additional removal of surface material is repeated until the appropriate flatness is achieved.

Illustrative Embodiment. To illustrate certain concepts of the invention, a description of an exemplary implementation of the invention is provided next. Reference is made to FIG. 1 and FIG. 2, which illustrate this exemplary probe station.

Referring to FIG. 1, a temperature-controlled test zone casing 104 encloses a test zone region 113. The test zone casing encloses an inner magnetic shield casing 105. The test zone casing 104 and magnetic shield casing 105 enclose the test zone 113.

A probe card 108 for testing devices is located in the test zone 113. A bridge 107 provides a structure for supporting the probe card above the test substrate, where the contacts of the probe card are oriented downwards towards the testing surface.

Still referring to FIG. 1, a chuck 102 comprising a planar testing surface for receiving a semiconductor wafer 127. The chuck 102 includes tensioned, actuatable clamping element 126 that provide a force for retaining the wafer 127 on the chuck surface. One or more cooling elements, for example, a cryogenic heat exchanger 123 is present on the column 101 and creates a low temperature environment for the test zone 113. The testing surface is maintained within selected cryogenic temperatures by cooling of the casing 104 enclosing the test zone. Loading of the bare wafer directly on the chuck 102 set to the cryogenic temperature results in direct cooling of the wafer. The test apparatus includes inlet openings 116a-d located on the plurality of casings that provide access for loading test substrates onto the receiving surface located in the test zone 113.

In certain embodiments, a thermal buffer casing 125 defines the second thermally defined environment of the thermal buffer zone 121, for example, set to a different temperature than the first thermally defined environment of the test zone. In typical embodiments, the first thermally defined environment of the test zone 113 is set to a lower temperature than the thermally defined environment of the second thermal buffer zone 121. In other embodiments, the first thermally defined environment and the second thermally defined environment are the same temperature. The thermal buffer zone surrounds the thermally defined test zone environment and aids in its insulation against heat ingress from the external environment. Still referring to FIG. 1, the probe station comprises a central vertical column 101. The chuck 102 and its testing surface are located on a first, upper end of the column, where the testing surface is located in the test zone chamber and is configured to receive the electronic component. A motion stage 103 is connected to the second, lower end of the column, where the motion stage is configured to actuate the column in at least the horizontal and vertical axes. In certain embodiments of the invention, the motion stage moves the testing surface in a horizontal direction (x and y axes), a vertical direction (z-axis), and rotational direction ($\varphi$, $\theta$, $\psi$ angles). Adjustment and alignment of the test substrate with the probe card is accomplished by moving the column and its affixed testing surface and wafer in a lateral direction. Raising and lowering the test substrate is performed to contact the circuit elements of the wafer with contacts of the probe card. Rotation of the test substrate further allows alignment of the probe card contacts with target sites on the wafer.

Referring to FIG. 1, the column 101 extends through the bottom openings in the test zone casing, magnetic shield casing, and thermal buffer casing to connect with the motion stage. A first floating shield 109 is oriented substantially perpendicular from the central axis of the column, and covers the bottom openings of the test zone casing and magnetic shield casing. In certain embodiments, the first floating shield includes a magnetic shielding layer 111. The first floating shield covers the bottom of the test zone 113 in order to help maintain the magnetic isolation and defined thermal conditions in the test zone chamber. The first floating shield has a diameter larger than the bottom opening of the first casing and magnetic shield casing, wherein lateral movement of the first floating shield maintains the coverage of these openings. The first floating shield can be lowered and raised. When raised, the vertical gap 112 between the bottom of the test zone casing and the top of the floating shield may be eliminated, or reduced to a distance of less than 1 mm to effectively seal the test zone chamber and maintain the temperature conditions and magnetically shielded environment of the test zone. In certain embodiments of the invention, the gap 112 comprises a distance of less than 1 mm, although a distance of greater than 1 mm is contemplated.

In the exemplary probe station of FIG. 1 and FIG. 2, the test zone casing is enclosed by a thermal buffer casing. The thermal buffer casing comprises a bottom surface further having a bottom opening. A second floating shield 119 covers the bottom opening of the thermal buffer casing to help enclose the thermal buffering zone 121. The second floating shield 119 has a diameter larger than the bottom opening of the thermal buffer casing, where lateral movement of the second floating shield maintains the coverage of bottom opening during lateral actuation of the column. The second floating shield 119 can be lowered and raised. When raised, the vertical gap 120 between the bottom of the thermal buffer casing and the top of the second floating shield may be eliminated or reduced to a distance of less than 1 mm to aid in maintaining the temperature conditions of the thermal buffer zone.

The outermost chamber, defined by the outer housing 124, further contains a motion stage 103.

The foregoing description has been made with reference to an exemplary orientation of the apparatus, e.g., reference to top, bottom, lateral, and vertical aspects. It will be understood that this description is exemplary only and that the apparatus may be configured in any number of orientations, e.g. a device having vertical orientation of the wafer, for example, a device as described herein wherein the vertical axis and horizontal axes are rotated degrees from the depictions in FIG. 1 and FIG. 2. Likewise, in an alternative implementation, the floating shields of the invention are configured to be above the bottom openings of the casings.

Methods of Use.

The scope of the invention further encompasses methods of using the apparatus described herein to test circuits on wafers or other electronic components. In a general method of the invention, the testing process comprises a series of steps as follows:

- by the arm of a wafer feeding system, a wafer in the wafer feeding system is lifted;
- the doors covering the aligned gated slots of the several casings of the apparatus are actuated to provide an opening for introduction of the wafer into the testing apparatus;
- the arm of the wafer feeding system and wafer thereon are extended through the series of gated slots and the wafer is introduced to the planar test surface of the chuck, wherein the chuck is located in a magnetically isolated and thermally defined test zone enclosed by the first casing and, if present, magnetic shield casing;
- the chuck mechanism is actuated with lift pins that raise the wafer above the arm of the wafer feeding system;
- the arm of the wafer feeding system is retracted;
- the doors and slot valve are closed;
- the clamping elements of the chuck are actuated to secure the wafer to the testing surface of the chuck;

the wafer is rapidly cooled to the cryogenic temperature of the test zone defined by the test zone casing;

the motion stage is engaged to position the wafer in a selected alignment under the probe card;

the column is moved vertically by the motion stage to contact the wafer with the pins of the probe card and simultaneously seal the test zone chamber and any thermal buffer zones by the floating shield(s);

the probe card is activated to test one or more circuits on the wafer and output signals are output to a data storage or processing element external to the testing device;

the column is lowered to a position wherein the probe card contacts do not contact the wafer;

the previous four steps are repeated one or more times to test a plurality of circuits or devices on the wafer;

the series of aligned gates is actuated to provide an opening for the arm of the wafer feeding system;

the clamping elements of the chuck are actuated to release the wafer; and the arm of the wafer feeding system is extended into the testing apparatus and the wafer is lifted and removed by the arm.

The cryogenic conditions of the test zone and thermal buffer chamber(s) may be selected based on the desired test conditions. In a primary embodiment of the invention, the test substrate is directly cooled to a temperature between 0K to 6K, for example, 1K, 2K, 3K, 4K, or 5K. It will be appreciated that in other embodiments, test substrates may be cooled to temperatures above 6K. In certain embodiments, a thermal buffer casing encloses the test zone casing and has a temperature between 0K to 150K. In certain embodiments of the invention, the thermal buffer chamber has a temperature of 40-60 K, for example, about 50K.

The novel systems of the invention enable direct cooling of bare wafers on the chuck, greatly decreasing the time required for cooling. While substantial thermal contraction is experienced by the wafer during the rapid cooling process, the inventors of the present disclosure have advantageously determined that silicon wafers are resistant to tensile strain forces and do not shatter when clamped to the chuck at their edges during the rapid cooling process. During the return to ambient conditions following testing, the wafer experiences substantial thermal expansion, but is free of any carrier body or the clamping mechanism of the chuck and does not typically experience forces that cause wafer shatter.

All manner of electronic devices may be tested by the apparatus and methods of the invention. In a primary embodiment, wafers are tested, for example, 150 mm, 200 mm or 300 mm wafers, as known in the art, for example, comprising cryogenic devices, i.e. devices configured to operate at ultra-low temperatures, for example, superconductors, quantum computing circuits, or other low temperature devices.

The dimensions of the component to be tested will dictate the size of the components of the wafer testing systems. For example, the housing, outer casing, inner casing, chuck, floating shields and other components will be sized to accommodate the wafer or other component that is being tested and the required range of motion to position all devices on the wafer or other component under the probe station. Exemplary systems may comprise, for example, an outer housing of 500 cm to 2 meters in diameter, a test zone casing of 25-100 cm in diameter, a 50K thermal buffer housing of 400 cm to 1.5 meters in diameter, an outer housing height of 300 cm to 1 meters, and a floating shield diameter of 300 cm to 1 meter.

By the systems and methods of the invention, a plurality of wafers may be tested very rapidly, while avoiding wafer shattering problems, and avoiding the use of adhesives or greases that must be cleaned from wafers. For example, in some implementations, processing speeds of a few hours per wafer may be achieved, in contrast to the much longer times necessary when using prior art wafer testing systems.

Exemplary Embodiments. The following section describes various configurations and embodiments of the wafer testing systems of the invention.

Primary Embodiment. In a primary embodiment, a device for testing electronic components under controlled conditions such as cryogenic conditions, the device comprising a test zone encased by a thermally shielded housing comprising a bottom opening, through which passes a vertical column in connection with a motion stage at its bottom end and, at its top end, a chuck configured to receive an electronic component such as a wafer. A probe station is mounted above the chuck. The bottom opening enables the column to be moved laterally such that the entire working surface of the component clamped to the chuck can be accessed by the probe station. To maintain the thermal shielding and controlled conditions of the test zone, the bottom opening of the test zone casing is shielded by a shielding element, wherein the shielding element comprises:

a floating shield;

a flexible bellows; or a combination floating shield and flexible bellows.

In one embodiment, the device is configured as follows: An apparatus for testing a device under defined thermal conditions, comprising:

an outer housing 124; wherein, located within the chamber defined by the outer housing is:

a chuck 102, the chuck comprising a surface for receiving a device and one or more clamping elements 126 which are configured to be actuated to retain the device to the surface of the chuck;

wherein the chuck is connected to a motion stage 103 through a column 101, and wherein the motion stage is configured to actuate the column at least laterally and vertically;

a probe card 108 configured for contacting the device with one or more contacts;

a test zone 113 defined by a test zone casing 104, wherein the test zone casing encloses the chuck and probe card, wherein the test zone casing and outer housing comprise coplanar aligned slots through which a wafer may be introduced to the chuck wherein the test zone casing comprises thermal shielding material, wherein the test zone casing comprises a bottom surface having an opening through which the thermally isolated test zone is accessed by the column, wherein the thermally isolated test zone comprises one or more cooling elements 123, wherein the probe card 108 is attached to the test zone casing by one or more support elements 107 and is disposed over the testing surface of the chuck;

wherein the bottom opening of the test zone casing is thermally shielded by a shielding element circumscribing the column;

wherein the shielding element comprises:

a floating shield;

a flexible bellows; or a combination floating shield and flexible bellows.

In one implementation of the primary embodiment, the shielding element comprises a floating shield 109;
  wherein the floating shield comprises a thermal shielding material; and
  wherein the floating shield has an upper, horizontal surface that is wider than the bottom opening of the test zone casing, such that the column may be actuated laterally while maintaining coverage of the bottom opening of the test zone casing by the floating shield.

In one implementation of the primary embodiment, the shielding element comprises a flexible bellows. The flexible bellows may comprise foil, foil encased springs, or a textile coated or impregnated with thermal shielding material. The bellows will comprise a tube, ring, skirt, or funnel having an upper lip and lower lip. In various embodiments, the bellows is concertinaed, pleated, corrugated or folded such that it is compliant and can move across a range of motion. The upper lip of the bellows will be connected to the test zone casing around its bottom opening. The lower lip will be connected to a floating shield or to the central column. In the case of a combined flexible bellows and floating shield, the floating shield may be smaller than, equal to, or larger than the size of the bottom opening.

The one or more cooling elements of the test zone will comprise any structure or device which withdraws heat from the components enclosed within the test zone. The one or more cooling elements may be located within the column. The one or more cooling elements may be located on the outer or inner surface of the test zone casing.

In one embodiment the test zone comprises one or more heat exchanger, for example, for example, a heat exchanger comprising coils or other structures through which a liquid cryogen is flowed, such as liquid helium, liquid nitrogen, or other liquefied gases. The heat exchangers may be provided with a cryogen from lines within the outer housing in connection with pumps and cryogen reservoirs outside of the outer housing.

In one embodiment, the cooling element comprises one or more flexible straps. The flexible straps will be of sufficient thermal conducive capacity to cool the elements of the test zone to the desired temperatures, and will be sufficiently flexible to move with the column as it is actuated across its full range of motion (defined by the opening of the test zone casing and any casings enclosing such). In one embodiment, the flexible strap comprises multiple layers of foil, in one embodiment being 5-10 layers of foil, in one embodiment each layer being of 0.25 to 2 mm in thickness. In various embodiments, the foil comprises a metal such as copper, aluminum, or alloys thereof. The flexible strap is in connection with a cryocooler, for example, a closed system cryocooler, the connection by means of a thermal link structure.

In various embodiments of the primary implementation, the device is configured to maintain the test zone at a temperature of 1 K, 2K, 3K, 4K, 5K, 6K, or greater.

Magnetically Shielded Test Zone. In a second implementation of the primary embodiment, the test zone is magnetically shielded by a combination of a magnetic shield casing located within the test zone casing and having a bottom opening; and by the floating shield and/or bellows. In one embodiment, a floating shield is present and the top surface of the floating shield comprises a layer of magnetic shielding material. In one embodiment, a flexible bellows is present and the flexible bellows comprises magnetic shielding material.

In one embodiment, the second implementation of the primary embodiment may comprise apparatus for testing an electronic component under defined thermal conditions as in the primary embodiment,
  further comprising elements that magnetically isolate the test zone;
  wherein the apparatus comprises a magnetic shield casing;
  wherein the magnetic shield casing comprises magnetic shielding material;
  wherein the magnetic shield casing encloses the chuck and probe card;
  wherein the magnetic shield casing is enclosed by the test zone casing;
  wherein the magnetic shield casing comprises a bottom surface having an opening through which the column is connected to the chuck;
  wherein the magnetic shield casing comprises a slot covered by a door that can be actuated to open and close the slot, wherein such slot is aligned with the aligned slots of the outer housing and test zone casing; and
  wherein the floating shield and/or flexible bellows comprise magnetic shielding material.

Thermal Buffers. In various embodiments of the primary embodiment, the test zone casing is enclosed within one or more concentric thermal buffer casings. In one embodiment, a single thermal buffer casing encloses the test zone casing. The one or more thermal buffer casings will comprise a bottom opening, through which the column connecting the chuck to the motion stage passes. The bottom opening will be of sufficient width to enable lateral movement and positioning of the chuck such that the entire working surface of the electronic component can be accessed by the probe station. wherein the bottom opening of the test zone casing is thermally shielded by a shielding element circumscribing the column;
  wherein the shielding element comprises:
    a floating shield;
    a flexible bellows; or
    a combination floating shield and flexible bellows.

In one implementation of the primary embodiment, the thermal buffer casing bottom opening shielding element comprises a floating shield 119;
  wherein the floating shield comprises a thermal shielding material; and
  wherein the floating shield has an upper, horizontal surface that is wider than the bottom opening of the thermal buffer casing, such that the column may be actuated laterally while maintaining coverage of the bottom opening of the test zone casing by the floating shield.

In one implementation of the primary embodiment, the thermal buffer casing bottom opening shielding element comprises a flexible bellows. The flexible bellows may comprise foil, foil encased springs, or a textile coated or impregnated with thermal shielding material. The bellows will comprise a tube, ring, skirt, or funnel having an upper lip and lower lip. The upper lip will be connected to the test zone casing around its bottom opening. The lower lip will be connected to a floating shield or to the central column. In the case of a combined flexible bellows and floating shield, the floating shield may be smaller than, equal to, or larger than the size of the bottom opening.

In on implementation of the primary embodiment is an apparatus for testing an electronic component under defined thermal conditions as in the primary embodiment, wherein the apparatus comprises a one or more thermal buffer zones;

wherein each of the one or more thermal buffer zones is defined by a thermal buffer casing;

wherein each of the one or more thermal buffer casings comprises thermal shielding material;

wherein one or more cooling elements are present within or on each of the one or more thermal buffer casings;

wherein each of the one or more thermal buffer casings encloses the test zone casing;

wherein each of the one or more thermal buffer casings comprises a slot covered by a door that can be actuated to open and close the slot, wherein such slot is aligned with the aligned slots of the outer housing and test zone casing;

wherein each of the one or more thermal buffer casings comprises a bottom opening through which the central column traverses;

wherein, for each of the one or more thermal buffer casings, the central column is circumscribed by a thermal buffer floating shield disposed below the bottom surface of its associated thermal buffer casing;

wherein each thermal buffer floating shield comprises a thermal shielding material;

wherein each thermal buffer floating shield has an upper, horizontal surface that is wider than the bottom opening its associated thermal buffer casing, such that the column may be actuated horizontally while maintaining coverage of the bottom opening by the thermal buffer floating shield.

Each thermal buffer casing will comprise or enclose one or more cooling elements. The one or more cooling elements may be located within the column. The one or more cooling elements may be located on the outer or inner surface of the thermal buffer casing. In one embodiment the thermal buffer casing comprises or encases one or more heat exchanger, for example, for example, a heat exchanger comprising coils or other structures through which a liquid cryogen is flowed, such as liquid helium, liquid nitrogen, or other liquefied gases. The heat exchanger(s) may be provided with a cryogen from lines within the outer housing in connection with pumps and cryogen reservoirs outside of the outer housing.

In one embodiment, the cooling element comprises one or more flexible straps. The flexible straps will be of sufficient thermal conductive capacity to cool the elements of the test zone to the desired temperatures, and will be sufficiently flexible to move with the column as it is actuated across its full range of motion (defined by the opening of the test zone casing and any casings enclosing such). In one embodiment, the flexible strap comprises multiple layers of foil, in one embodiment being 5-10 layers of foil, in one embodiment each layer being of 0.25 to 2 mm in thickness. In various embodiments, the foil comprises a metal such as copper, aluminum, or alloys thereof. The flexible strap is in connection with a cryocooler, for example, a closed system cryocooler, the connection by means of a thermal link.

In one embodiment, the apparatus comprises a test zone casing wherein the test zone casing is configured to be maintained at a temperature of 1-6K and a thermal buffer casing wherein the thermal buffer casing is configured to be maintained at a temperature between 35-80 K, in one embodiment about 50K.

Wafer Chuck. The scope of the invention encompasses a novel chuck for receiving wafers and other devices. The chuck comprises a receiving surface and surrounding clamping elements that hold the wafer 127 at its edges. Actuation of the clamping element is achieved by rods, for example, a push bar, in connection with one or more motorized actuators. In various embodiments the chuck comprises 2, 3, 4, 5, or more spring-tensioned clamps that can be lifted by a central actuation rods to create a receiving space for the wafer, and which can be released after introduction of the wafer, wherein, by the spring tension, the spring tensioned claims will retract downwards and clamp the wafer to the chuck surface.

In certain embodiments, the chuck 102 comprises one or more actuatable clamping elements 126, the clamping elements 126 comprising a clamp 300 attached to a cross member 306, where the cross member is disposed below the receiving surface platform 305 of the chuck;

wherein springs 302 make contact between the cross member and the platform;

wherein, a plurality of vertical supports 301 is connected to the cross member 306, and pass through openings 303 located on the platform 305; wherein a push bar 304, attached to the cross member 306 is configured such that when it is lifted upwards relative to the platform 305, the springs 302 are compressed, and a space opens between the clamp 300 and the platform 305 for delivery of a wafer 127 or other component, in one embodiment introduced by a wafer delivery arm 307; wherein the chuck is configured such that when the push bar 304 is released, the springs 302 located between the platform and cross member place a force upon the cross member 306, lowering of the cross member, and thus the clamping element which is attached to the cross member, such that the clamps 300 provide a downward force against a wafer 127 placed on the platform 305; and wherein the chuck is configured that the vertical supports 301 may be lowered simultaneously to the push bar being released, such that the wafer is lowered onto the surface of the platform 305.

The chuck of the invention may be used in any context for securing an electronic component or other test piece to a surface, for example, a surface in connection with a motion stage. In one implementation, the chuck of the invention is utilized in an apparatus for testing electronic components configured as in the primary embodiment.

Gated Doors. In one implementation, the scope of the invention encompasses a novel gated door assembly for the transfer of components, such as wafers, between chambers comprising two separate casings. The door assembly is located in a space between adjacent housing walls wherein aligned coplanar slots in the adjacent casings are present. The door assembly comprises a first door which is a planar body sized and shaped to cover a first slot in a first casing and an opposing second door which is a planar body sized and shaped to cover a second slot in the second casing, wherein the first and second slots are aligned, i.e., coplanar. The doors will comprise a thermal shielding material, in one embodiment a metal such as aluminum, copper, steel or alloy of the foregoing. In one embodiment, the door further comprises an outer surface comprising a layer of magnetic shield material. One or more spring elements between the doors will tension the door elements in opposing directions, pressing them up against the casings, the one or more springs being separated from door by an intervening insulating element, in various embodiments being a ceramic, polymeric, or other insulating material that prevents heat transfer from the door to the one or more springs. The one or more springs are mounted on a vertically oriented push bar that is in mechanical connection with an actuator such that the push bar can be raised and lowered. In operation, the doors are configured in a first position such that they cover the coplanar slots in the adjacent casings. By actuating the push bar, the door assembly may be raised or lowered such that it slides above or below the slots and creates a clear path for the passage of a component, e.g. a wafer, through the aligned slots.

In some implementations, the door assembly of the invention is deployed in any system comprising two adjacent casing walls with coplanar slots. In one implementation, the door assembly of the invention is utilized in the primary implementation of the invention, in one embodiment a door assembly being present between the test zone casing and adjacent thermal buffer casing, and/or being present between the thermal buffer casing and outer housing.

Vacuum Chamber Base. In one implementation, the scope of the invention encompasses a base for use in a vacuum chamber, comprising
- a slab comprising a high stiffness material; and
- a vacuum vessel plate mounted on top of the slab by a plurality of fasteners; and
- wherein the top surface of the vacuum vessel plate has high flatness.

In one embodiment, the slab comprises stone; in one embodiment the slab comprises granite; in one embodiment, the vacuum vessel plate comprise metal; in one embodiment, the vacuum vessel plate comprises metal selected from the group consisting of steel, aluminum, copper, and an aluminum alloy; in one embodiment the flatness of the upper surface of the vacuum vessel plate is between 1 and 15 microns. In one embodiment, the vacuum vessel plate is mounted to the slab by a plurality of studs or tie-rods.

In one embodiment, the invention encompasses a base for use in a vacuum chamber, comprising a slab comprising a high stiffness material and comprising a top surface of high flatness; wherein the top surface of the slab has been treated with resin to create an airtight layer of material.

In one embodiment, the invention encompasses an apparatus for testing a device under defined thermal conditions, comprising:
- an outer housing 124 comprising a vacuum vessel plate 401;
- the vacuum vessel plate comprising a first surface 410 of high flatness, and a second surface;
- a slab 400 comprising a through opening 412; and a fastener comprising a first end disposed on a first side of the slab and connected to the vacuum vessel plate second surface, and a second end disposed and fastened on a second side of the slab, wherein the fastener is placed in the through opening of the slab. In one embodiment, one or more adjustable feet 402 are attached to the slab second side. In one embodiment, the slab comprises granite. In one embodiment, the the vacuum vessel plate second surface further comprises a fastening hole; and
- wherein the fastener comprises a nut, and a stud having a first end and a second end, the stud disposed in the through opening of the slab, the first end of the stud connected to the fastening hole of the vacuum vessel plate on a first side of the slab, and the second end fastened with the nut on a second side of the slab.

In one embodiment the flatness tolerance is less than 6 microns.

The vacuum chamber base of the invention may be utilized in any vacuum chamber. In one embodiment, the vacuum chamber base is utilized as the base of the outer housing in the primary implementation of the invention.

Wafer Testing System. In one implementation the scope of the invention encompasses a wafer testing system, comprising an apparatus for testing a device as in the primary implementation and further comprising a wafer feeding system located exteriorly to the outer housing of the apparatus for testing an electronic component, wherein the wafer feeding system comprises a plurality of wafers and an arm that can be actuated to introduce wafers to and remove wafers from the test zone of the apparatus for testing an electronic component.

Configurations. The devices of the invention may be configured in any number of configurations, for example, the device of the primary implementation may be configured wherein the bottom opening of the test zone casing is thermally shielded by a floating shield and/or flexible bellows and may be combined with all of the following features or a subset thereof: cooling by liquid cryogen heat exchangers and/or cooling by means of a flexible thermally conductive strap; a magnetic shielding casing; one or more thermal buffer casings, wherein the bottom opening of the one or more thermal buffer casings may be shielded by a floating shield and/or a flexible bellows; a chuck of the invention; a door assembly of the invention; and a vacuum chamber base of the invention.

Methods of Use. The scope of the invention further encompasses methods of using the devices and systems described herein. In one embodiment is provided a method for testing an electronic component under defined thermal conditions, comprising:
- by the arm of an exterior component feeding system, introducing the electronic component to the chuck in the thermally isolated test zone of the apparatus of the invention, via a series of aligned slots in the outer casing, any intervening thermal buffer casings, the test zone casing and if present, the magnetic shielding casing; engaging clamping elements on the chuck to retain the electronic component on the chuck surface;
- by the motion stage, moving the central column, connected chuck and retained electronic component horizontally under the probe card to a selected position;
- by the motion stage, moving the central column, connected chuck and retained electronic component vertically such that the electronic component is contacted by one or more contacts of the probe card;
- engaging the probe card to make inputs to and record outputs from the electronic component.

In one embodiment, the electronic component is a wafer. In various embodiments, the wafer comprises a 50 mm, 150 mm, 200 mm or 300 mm wafer. In various embodiments, the wafer comprises a plurality of cryogenic devices, in various embodiments, the cryogenic devices comprising superconductors and/or quantum computing circuits.

In one embodiment, the testing process is carried out wherein the wafer is maintained at a temperature of 1-6 K.

EXAMPLES

Example 1. A wafer probe station substantially as depicted in FIG. 1 and FIG. 2 was constructed, comprising floating shields. The test zone was maintained continuously at about 4K. The thermal buffer zone was maintained continuously at about 50K. 200 mm wafers comprising cryogenic devices were introduced into the system by a wafer feeding device. Wafers were rapidly cooled, assessed by the probe station and removed with no wafer shattering and throughput of several wafers per hour.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

What is claimed is:

1. An apparatus for testing a device under defined thermal conditions, comprising: an outer housing;
    wherein, located within a chamber defined by the outer housing is:
        a chuck, the chuck comprising a surface for receiving a device and one or more clamping elements which are configured to be actuated to receive and retain the device to the surface of the chuck;
        wherein the chuck is connected to a motion stage by a column, and wherein the motion stage is configured to actuate the column at least laterally and vertically;
        a probe card configured for contacting the device with one or more contacts;
        a test zone enclosed by a test zone casing;
        wherein the test zone casing encloses the chuck and the probe card;
        wherein the probe card is attached to the test zone casing by one or more support elements and is disposed over the surface of the chuck;
        wherein the test zone casing and the outer housing comprise coplanar aligned slots through which a wafer may be introduced to the chuck;
        wherein the test zone casing comprises thermal shielding material;
        wherein the test zone casing comprises a bottom surface having an opening through which the test zone is accessed by the column;
        wherein the test zone comprises one or more cooling elements located within the test zone casing, on the test zone casing or in the column;
        wherein the opening in the bottom surface of the test zone casing is thermally shielded by a shielding element circumscribing the column; and
            wherein the shielding element comprises:
                a floating shield;
                a flexible bellows; or
                a combination floating shield and flexible bellows.

2. The apparatus of claim 1, wherein the shielding element comprises a floating shield;
    wherein the floating shield comprises thermal shielding material; and
    wherein the floating shield has an upper, horizontal surface that is wider than the opening in the bottom surface of the test zone casing, such that the column may be actuated laterally while maintaining coverage of the opening in the bottom surface of the test zone casing by the floating shield.

3. The apparatus of claim 1, wherein the shielding element comprises a flexible bellows.

4. The apparatus of claim 3, wherein the flexible bellows comprises a concertinaed or pleated tube, ring, skirt, or funnel having an upper lip and a lower lip; and
    wherein the upper lip is connected to the test zone casing around the opening in the bottom surface and the lower lip is connected to a floating shield or to the column.

5. The apparatus of claim 1, wherein the one or more cooling elements of the test zone comprises a heat exchanger through which a liquid cryogen is flowed.

6. The apparatus of claim 5, wherein the liquid cryogen comprises liquid helium.

7. The apparatus of claim 1 wherein the one or more cooling elements of the test zone comprise one or more flexible straps in connection with a cooling stage of a cryocooler by thermally conducting elements.

8. The apparatus of claim 7, wherein the one or more flexible straps comprise multiple layers of metal foil.

9. The apparatus of claim 8, wherein the metal foil comprises copper, aluminum, or alloys thereof.

10. The apparatus of claim 1, wherein the apparatus is configured to maintain a device in the test zone at a temperature of 1 to 6K.

11. The apparatus of claim 1, wherein the test zone is magnetically shielded by a combination of:
    a magnetic shield casing comprising magnetic shielding material and located within the test zone casing and enclosing the chuck, the magnetic shield casing having a bottom opening; and
    by the floating shield or the flexible bellows wherein the floating shield or the flexible bellows comprises magnetic shielding material.

12. The apparatus of claim 11, wherein the apparatus comprises a magnetic shield casing:
    wherein the magnetic shield casing comprises magnetic shielding material;
    wherein the magnetic shield casing encloses the chuck and the probe card;
    wherein the magnetic shield casing is enclosed by the test zone casing;
    wherein the magnetic shield casing comprises a bottom surface having an opening through which the column is connected to the chuck;
    wherein the magnetic shield casing comprises a slot covered by a door that can be actuated to open and close the slot, wherein such slot is aligned with the coplanar aligned slots of the outer housing and test zone casing; and
    wherein the floating shield or the flexible bellows comprise magnetic shielding material.

13. The apparatus of claim 1, wherein
    the test zone casing is enclosed within one or more thermal buffer casings;
    wherein each of the thermal buffer casings is in contact with or encases one or more cooling elements;
    wherein each of the one or more thermal buffer casings comprises a bottom opening, through which the column connecting the chuck to the motion stage passes;
    wherein each of the one or more thermal buffer casings comprises a thermal shielding material;
    wherein the opening in the bottom surface of the test zone casing is thermally shielded by a shielding element circumscribing the column; and
    wherein the shielding element comprises:
        a floating shield;
        a flexible bellows; or
        a combination floating shield and flexible bellows.

14. The apparatus of claim 13, wherein the apparatus comprises one or more thermal buffer zones;
    wherein each of the one or more thermal buffer zones is defined by a thermal buffer casing;

wherein each of the one or more thermal buffer casings comprises thermal shielding material;

wherein one or more cooling elements are present in contact with or within each of the one or more thermal buffer casings;

wherein each of the one or more thermal buffer casings encloses the test zone casing;

wherein each of the one or more thermal buffer casings comprises a slot covered by a door that can be actuated to open and close the slot, wherein such slot is aligned with the coplanar aligned slots of the outer housing and test zone casing and magnetic shield casing, if present;

wherein each of the one or more thermal buffer casings comprises a bottom opening through which the column traverses;

wherein, for each of the one or more thermal buffer casings, the column is circumscribed by a thermal buffer floating shield disposed below a bottom surface of its associated thermal buffer casing;

wherein each thermal buffer floating shield comprises a thermal shielding material;

wherein each thermal buffer floating shield has an upper, horizontal surface that is wider than the bottom opening of its associated thermal buffer casing, such that the column may be actuated horizontally while maintaining coverage of the bottom opening by the thermal buffer floating shield.

15. The apparatus of claim 13, wherein the apparatus comprises a single thermal buffer casing.

16. The apparatus of claim 15, wherein the apparatus comprises a test zone casing wherein the test zone casing is configured to be maintained at a temperature of 1-6 K and a thermal buffer casing wherein the thermal buffer casing is configured to be maintained at a temperature between 35-80 K.

17. The apparatus of claim 16, wherein the thermal buffer casing is configured to be maintained at a temperature of about 50K.

18. The apparatus of claim 13, wherein the one or more cooling elements of the test zone comprise a heat exchanger through which a liquid cryogen is flowed.

19. The apparatus of claim 18, wherein the liquid cryogen comprises liquid helium.

20. The apparatus of claim 13, wherein
the one or more cooling elements of the test zone comprise one or more flexible straps in connection with a cooling stage of a cryocooler via thermally conductive elements.

21. The apparatus of claim 1, wherein
the chuck comprises a receiving surface and one or more spring-tensioned clamping elements surrounding the receiving surface of the chuck, the one or more spring-tensioned clamping elements being configured to hold a wafer to the chuck at its edges; wherein
the chuck is configured such that actuation of the one or more spring-tensioned clamping elements is achieved by connection to a push bar within the column in connection with one or more motorized actuators; wherein actuation of the push bar against the one or more spring-tensioned clamping elements lifts the one or more spring-tensioned clamping elements above the receiving surface of the chuck to create a receiving space for the wafer and wherein release of the push bar causes the one or more spring-tensioned clamping elements to retract downwards and clamp the wafer to the receiving surface.

22. The apparatus of claim 1, wherein the apparatus comprises a thermal buffer casing and wherein a door assembly is located between the adjacent thermal buffer casing and test zone casing, wherein the door assembly comprises:

a first door which comprises a planar body sized and shaped to cover a slot of the thermal buffer casing and a second, opposing door comprising a planar body sized and shaped to cover a slot of the test zone casing;

wherein the first door and the second, opposing door comprise thermal shielding material;

wherein one or more spring elements between the first door and the second, opposing door tension the one or more spring elements in opposing directions against the thermal buffer casing and the test zone casing, with ends of the one or more spring elements being separated from the first door and the second, opposing door by intervening insulating elements;

wherein the one or more spring elements are in connection with an element connected to a push bar, wherein the push bar is in mechanical connection with an actuator such that the push bar can be moved to move the door assembly;

wherein the door assembly is configured such that actuation of the push bar slides the first door and the second, opposing door such that the coplanar aligned slots of the thermal buffer casing and test zone casing are exposed.

23. The apparatus of claim 22, wherein the apparatus comprises a magnetic shield casing within the test zone casing; and wherein the second, opposing door comprises a layer of magnetic shielding material.

24. The apparatus of claim 1, wherein the outer housing is affixed to a base, the base comprising:
a slab comprising a high stiffness material; and
a vacuum vessel plate mounted on top of the slab by a plurality of fasteners; and
wherein a top surface of the vacuum vessel plate has high flatness.

25. The apparatus of claim 24, wherein the slab comprises stone.

26. The apparatus of claim 25, wherein the slab comprises granite.

27. The apparatus of claim 25, wherein the high flatness of the top surface of the vacuum vessel plate is between 1 and 15 microns.

28. The apparatus of claim 27, wherein
a flatness tolerance of the top surface of the vacuum vessel plate is less than 6 microns.

29. A method for testing an electronic component under defined thermal conditions, comprising:
by an arm of an exterior component feeding system, introducing the electronic component to the chuck in a thermally isolated test zone of the apparatus of claim 1;
wherein the electronic component is introduced via the coplanar aligned slots of the outer housing, any intervening thermal buffer casings, if present, the test zone casing, and, if present, a magnetic shielding casing;
engaging clamping elements on the chuck to retain the electronic component on the chuck surface;
by the motion stage, moving the column, connected chuck and retained electronic component horizontally under the probe card to a selected position;
by the motion stage, moving the column, connected chuck and retained electronic component vertically such that the electronic component is contacted by one or more contacts of the probe card;
engaging the probe card to make inputs to and record outputs from the electronic component.

30. The method of claim 29, wherein the electronic component is a wafer.

31. The method of claim 30, wherein the wafer comprises a plurality of cryogenic devices.

32. The method of claim 30, wherein the method for testing is carried out wherein the wafer is maintained at a temperature of 1-6 K.

* * * * *

UNITED STATES PATENT AND TRADEMARK OFFICE
CERTIFICATE OF CORRECTION

| | | |
|---|---|---|
| PATENT NO. | : 11,927,621 B2 | Page 1 of 1 |
| APPLICATION NO. | : 17/777580 | |
| DATED | : March 12, 2024 | |
| INVENTOR(S) | : Michael Snow et al. | |

It is certified that error appears in the above-identified patent and that said Letters Patent is hereby corrected as shown below:

On the Title Page

In Item (72) Inventors, and after "Joshua West, Boulder, CO (US)" please insert the following:
--; Sebastian Carl Janik, Berthoud, CO (US); and Erin Elizabeth Jaskot, Lyons, CO (US)--

Signed and Sealed this
Eleventh Day of March, 2025

Coke Morgan Stewart
*Acting Director of the United States Patent and Trademark Office*